(12) United States Patent
He et al.

(10) Patent No.: US 12,514,032 B2
(45) Date of Patent: Dec. 30, 2025

(54) SPHERICAL LIGHT-EMITTING CHIP AND MANUFACTURING METHOD THEREOF, AND DISPLAY DEVICE

(71) Applicant: HKC Corporation Limited, Guangdong (CN)

(72) Inventors: Hailong He, Guangdong (CN); Baohong Kang, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 328 days.

(21) Appl. No.: 18/219,820

(22) Filed: Jul. 10, 2023

(65) Prior Publication Data

US 2024/0234630 A1    Jul. 11, 2024

(30) Foreign Application Priority Data

Jan. 6, 2023   (CN) .......................... 202310018787.3

(51) Int. Cl.
*H10H 20/819*     (2025.01)
*H01L 25/075*     (2006.01)
(Continued)

(52) U.S. Cl.
CPC ....... *H10H 20/819* (2025.01); *H01L 25/0753* (2013.01); *H10H 20/01335* (2025.01);
(Continued)

(58) Field of Classification Search
CPC .............. H01L 25/0753; H10H 20/011; H10H 20/01335; H10H 20/80; H10H 20/819;
(Continued)

(56) References Cited

U.S. PATENT DOCUMENTS

2021/0296532 A1 * 9/2021 Tang .................... H10H 20/832

FOREIGN PATENT DOCUMENTS

| CN | 111540819 A | 8/2020 |
|---|---|---|
| CN | 211480078 U | 9/2020 |

(Continued)

OTHER PUBLICATIONS

International Search Report and Written Opinion dated Aug. 31, 2023 received in International Application No. PCT/CN2023/102726.

*Primary Examiner* — Cheung Lee
(74) *Attorney, Agent, or Firm* — Scully, Scott, Murphy & Presser, P.C.

(57) ABSTRACT

A spherical light-emitting chip and a manufacturing method thereof, and a display device are provided. The spherical light-emitting chip includes a light-emitting layer, a first electrode, a second electrode, and an alignment guiding layer. The first electrode is spaced apart from the light-emitting layer. The second electrode is spaced apart from the light-emitting layer. The second electrode and the first electrode are configured to load a voltage to enable the light-emitting layer to emit light. The spherical light-emitting chip has a central axis passing through a sphere center of the spherical light-emitting chip. The second electrode extends in a direction of the central axis, and the central axis passes through the second electrode. The alignment guiding layer is arranged around the second electrode, and a surface of the alignment guiding layer surrounding the second electrode is in contact with a peripheral side surface of the second electrode.

20 Claims, 19 Drawing Sheets

A-A

(51) Int. Cl.
    *H10H 20/01*          (2025.01)
    *H10H 20/831*        (2025.01)
    *H10H 20/857*        (2025.01)
    *H10H 20/825*        (2025.01)

(52) U.S. Cl.
    CPC ........ *H10H 20/831* (2025.01); *H10H 20/857* (2025.01); *H10H 20/825* (2025.01)

(58) Field of Classification Search
    CPC .. H10H 20/821; H10H 20/825; H10H 20/831; H10H 20/8312; H10H 20/84; H10H 20/853; H10H 20/855; H10H 20/857; H10H 29/011; H10H 29/10; H10H 29/49; H10H 29/80; H10H 29/8321; H10H 29/842; H10H 29/8517; H10H 29/853; H10H 29/855; H10H 29/8552; H10H 29/857; H10H 29/922; H10H 29/942
    See application file for complete search history.

(56) References Cited

FOREIGN PATENT DOCUMENTS

| | | |
|---|---|---|
| CN | 113707787 A | 11/2021 |
| WO | 2021082516 A1 | 5/2021 |

\* cited by examiner

```
┌─────────────────────────────────────────────────────────────┐
│ PROVIDE A SPHERICAL LIGHT-EMITTING CHIP 10, WHERE THE       │
│ SPHERICAL LIGHT-EMITTING CHIP 10 INCLUDES A LIGHT-EMITTING  │
│ LAYER 11, A FIRST ELECTRODE 12, A SECOND ELECTRODE 13, AND AN│
│ ALIGNMENT GUIDING LAYER 14, THE SPHERICAL LIGHT-EMITTING CHIP│
│ 10 HAS A CENTRAL AXIS 15 PASSING THROUGH A SPHERE CENTER OF │
│ THE SPHERICAL LIGHT-EMITTING CHIP 10, THE SECOND ELECTRODE 13│── S301
│ EXTENDS IN A DIRECTION OF THE CENTRAL AXIS 15, THE CENTRAL AXIS│
│ 15 PASSES THROUGH THE SECOND ELECTRODE 13, THE ALIGNMENT    │
│ GUIDING LAYER 14 IS ARRANGED AROUND THE SECOND ELECTRODE 13,│
│ AND A SURFACE OF THE ALIGNMENT GUIDING LAYER 14 SURROUNDING │
│ THE SECOND ELECTRODE 13 IS IN CONTACT WITH A PERIPHERAL SIDE│
│ SURFACE OF THE SECOND ELECTRODE 13                          │
└─────────────────────────────────────────────────────────────┘
                              │
                              ▼
┌─────────────────────────────────────────────────────────────┐
│ PROVIDE AN INKJET DEVICE 2, MIX A SOLVENT WITH THE SPHERICAL│── S302
│ LIGHT-EMITTING CHIP 10 TO FORM AN INK 70, AND INJECT THE INK 70│
│              INTO THE INKJET DEVICE 2                       │
└─────────────────────────────────────────────────────────────┘
                              │
                              ▼
┌─────────────────────────────────────────────────────────────┐
│ PROVIDE A SUBSTRATE 60. THE SUBSTRATE 60 INCLUDES RECESSES 21,│
│ AN ALIGNMENT GUIDING MEMBER 22, A THIRD ELECTRODE 23, AND A │── S303
│                    FOURTH ELECTRODE 24                      │
└─────────────────────────────────────────────────────────────┘
                              │
                              ▼
┌─────────────────────────────────────────────────────────────┐
│ THE INKJET DEVICE 2 DROPS THE INK 70 WITH THE SPHERICAL LIGHT-│── S304
│   EMITTING CHIP 10 INTO THE RECESS 21 OF THE SUBSTRATE 60   │
└─────────────────────────────────────────────────────────────┘
                              │
                              ▼
┌─────────────────────────────────────────────────────────────┐
│ ENCAPSULATE AND SOLIDIFY THE SPHERICAL LIGHT-EMITTING CHIP 10│── S305
│                    ON THE SUBSTRATE 60                      │
└─────────────────────────────────────────────────────────────┘
```

FIG. 13

SPHERICAL LIGHT-EMITTING CHIP AND MANUFACTURING METHOD THEREOF, AND DISPLAY DEVICE

CROSS-REFERENCE TO RELATED APPLICATIONS

This application claims priority under 35 U.S.C. § 119(a) to Chinese Patent Application No. 202310018787.3, filed Jan. 6, 2023, the entire disclosure of which is incorporated herein by reference.

TECHNICAL FIELD

This disclosure relates to the field of display technology, and in particular, to a spherical light-emitting chip and a manufacturing method thereof, and a display device.

BACKGROUND

In recent years, micro Light-Emitting Diodes (micro LEDs) and mini LEDs, as a new-generation display panel technology following Liquid Crystal Displays (LCDs) or Organic Light-Emitting Diodes (OLEDs), have low power consumption, fast response, long service life, high light efficiency, and other advantages.

Unlike an LCD screen in which a liquid crystal layer is sandwiched between two substrates, the micro LED display device includes only one display substrate with thousands of LED chips. Therefore, how to efficiently and precisely transfer LED chips to a target substrate becomes a current difficult problem.

SUMMARY

In a first aspect, a spherical light-emitting chip is provided in the disclosure. The spherical light-emitting chip includes a light-emitting layer, a first electrode, a second electrode, and an alignment guiding layer. The first electrode is spaced apart from the light-emitting layer. The second electrode is spaced apart from the light-emitting layer. The second electrode and the first electrode are configured to load a voltage to enable the light-emitting layer to emit light. The spherical light-emitting chip has a central axis passing through a sphere center of the spherical light-emitting chip. The second electrode extends in a direction of the central axis, and the central axis passes through the second electrode. The alignment guiding layer is arranged around the second electrode, and a surface of the alignment guiding layer surrounding the second electrode is in contact with a peripheral side surface of the second electrode.

In a second aspect, a display device is further provided in the disclosure. The display device includes a display substrate and the spherical light-emitting chip. The display substrate defines multiple recesses each configured to receive one spherical light-emitting chip.

In a third aspect, a manufacturing method of a spherical light-emitting chip is further provided in the disclosure. The method includes the following. Provide a first bearing substrate. Manufacture a light-emitting blank layer on the first bearing substrate. Perform array segmentation on the light-emitting blank layer to define multiple first through holes that penetrate through the light-emitting blank layer and are arranged at intervals. Provide an alignment-guiding blank layer at a side of the light-emitting blank layer away from the first bearing substrate. Define multiple second through holes penetrating through the alignment-guiding blank layer and multiple third through holes penetrating through the alignment-guiding blank layer. Dispose a conductive layer on the alignment-guiding blank layer. The conductive layer includes first conductive portions each received in one of the multiple second through holes and second conductive portions each received in one of the multiple third through holes. The first conductive portion is spaced apart from the light-emitting blank layer, and the second conductive portion is spaced apart from the light-emitting blank layer. The alignment-guiding blank layer surrounds the second conductive portion, and a surface of the alignment-guiding blank layer surrounding the second conductive portion is in contact with a peripheral side surface of the second conductive portion. Remove an excess portion of the alignment-guiding blank layer, an excess portion of the first conductive portion, and an excess portion of the second conductive portion to form a hemispherical light-emitting chip. Provide a second bearing substrate at a side of the hemispherical light-emitting chip away from the first bearing substrate. Peel off the first bearing substrate, and manufacture an end of the hemispherical light-emitting chip away from the second bearing substrate to be in a hemispherical shape. Peel off the second bearing substrate to obtain a spherical light-emitting chip. The spherical light-emitting chip has a central axis passing through a sphere center of the spherical light-emitting chip. The second conductive portion extends in a direction of the central axis, and the central axis passes through the second conductive portion.

BRIEF DESCRIPTION OF THE DRAWINGS

To describe technical solutions in implementations of the disclosure more clearly, the following will give a brief introduction to accompanying drawings required for describing implementations. Apparently, the accompanying drawings hereinafter described merely illustrate some implementations of the disclosure. Based on these drawings, those of ordinary skills in the art can also obtain other drawings without creative effort.

FIG. 13 is a schematic flow chart illustrating a transferring method of a spherical light-emitting chip in an implementation of the disclosure.

Figure 1:
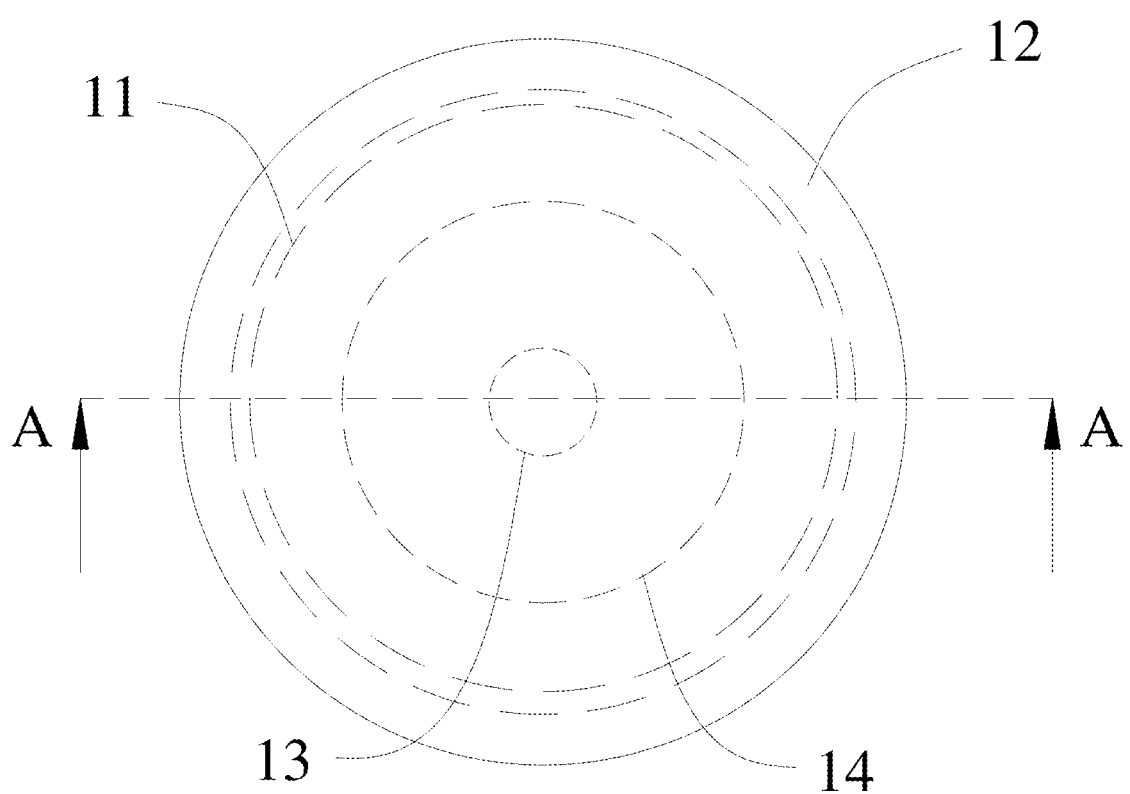
FIG. 1 is a schematic structural view of a spherical light-emitting chip in implementations of the disclosure.

FISG. 14A and 14B collectively show a schematic flow chart illustrating a transferring method of a spherical light-emitting chip in an implementation of the disclosure.

Illustration of Reference signs in the accompanying drawings:

1—display device, 2—inkjet device, 10—spherical light-emitting chip, 20—display substrate, 30—first bearing substrate, 40—second bearing substrate, 50—hemispherical light-emitting chip, 60—substrate, 70—ink, 11—light-emitting layer, 12—first electrode, 13—second electrode, 14—alignment guiding layer, 15—central axis, 16—sphere-center plane, 17—first semiconductor, 18—second semiconductor, 19—insulation layer, 21—recess, 22—alignment guiding member, 23—third electrode. 24—fourth electrode, 51—light-emitting blank layer, 52—first through hole, 53—alignment-guiding blank layer, 54—second through hole, 55—third through hole, 56—conductive layer, 57—first-semiconductor blank layer, 58—second-semiconductor blank layer, 59 insulation blank layer, 111—light-exiting surface, 112—peripheral side surface, 191—first insulation portion, 192—second insulation portion, 561—first conductive portion, 562—second conductive portion, 591—insulation body layer, 592—insulation blank portion, D—diameter of spherical light-emitting chip, $H_1$—height of first electrode, $H_2$—height of second electrode.

DETAILED DESCRIPTION

The following will illustrate clearly and completely technical solutions of implementations of the disclosure with reference to accompanying drawings of implementations of the disclosure. Apparently, implementations illustrated herein are merely some, rather than all implementations, of the disclosure. Based on the implementations of the disclosure, all other implementations obtained by those of ordinary skill in the art without creative effort shall fall within the protection scope of the disclosure.

The terms "first", "second", and the like used in the specification, the claims, and the accompany drawings of the disclosure are used to distinguish different objects rather than describe a particular order. The terms "include", "comprise", and "have" as well as variations thereof are intended to cover non-exclusive inclusion. For example, a process, method, system, product, or apparatus including a series of steps or units is not limited to the listed steps or units, it can optionally include other operations or units that are not listed; alternatively, other operations or units inherent to the process, method, product, or device can be included either.

The term "implementation" or "embodiment" referred to herein means that a particular feature, structure, or feature described in conjunction with the implementation or embodiment may be contained in at least one implementation of the disclosure. The phrase appearing in various places in the specification does not necessarily refer to the same implementation, nor does it refer to an independent or alternative implementation that is mutually exclusive with other implementations. It is explicitly and implicitly understood by those skilled in the art that an implementation described herein may be combined with other implementations.

Figure 2:
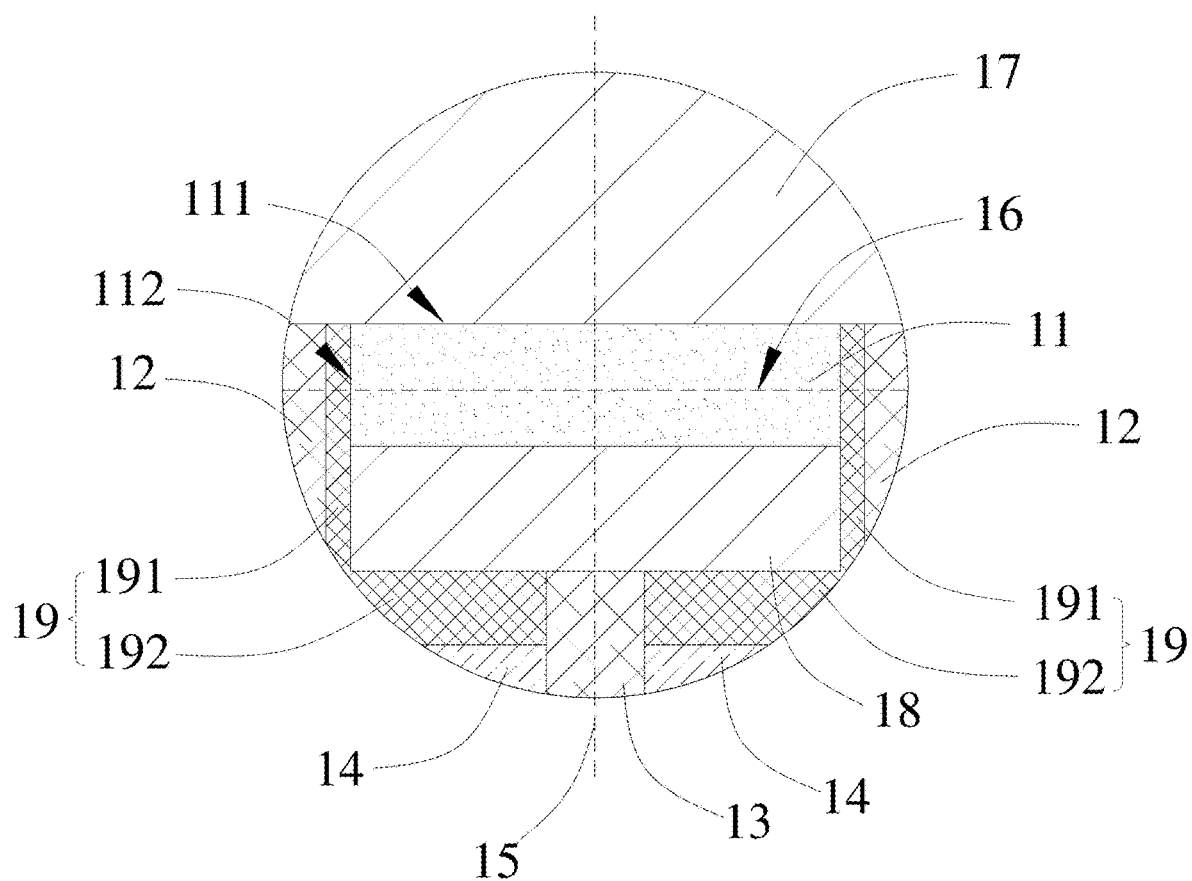
FIG. 2 is a schematic cross-sectional structural view of the spherical light-emitting chip provided in FIG. 1, taken along line A-A.

Referring to FIGS. 1 and 2, FIG. 1 is a schematic structural view of a spherical light-emitting chip in implementations of the disclosure, and FIG. 2 is a schematic cross-sectional structural view of the spherical light-emitting chip provided in FIG. 1, taken along line A-A. The spherical light-emitting chip 10 of implementations of the disclosure includes a light-emitting layer 11, a first electrode 12, a second electrode 13, and an alignment guiding layer 14. The first electrode 12 is spaced apart from the light-emitting layer 11. The second electrode 13 is spaced apart from the light-emitting layer 11. The second electrode 13 and the first electrode 12 are configured to load a voltage to enable the light-emitting layer 11 to emit light. The spherical light-emitting chip 10 has a central axis 15 passing through a sphere center of the spherical light-emitting chip 10. The second electrode 13 extends in a direction of the central axis 15, and the central axis 15 passes through the second electrode 13. The alignment guiding layer 14 is arranged around the second electrode 13, and a surface of the alignment guiding layer 14 surrounding the second electrode 13 is in contact with a peripheral side surface of the second electrode 13.

The spherical light-emitting chip 10 may be applicable to a micro Light-Emitting Diode (micro LED), a mini LED, or other display devices. It can be understood that the spherical light-emitting chip 10 may also be applicable to other devices, and application scenarios of the spherical light-emitting chip 10 shall not be a limit to the spherical light-emitting chip 10 provided in the implementation. The spherical light-emitting chip 10 may be an LED chip and is configured to convert electric energy into optical energy. An appearance surface of the spherical light-emitting chip 10 is designed to be spherical, which can reduce light reflection in the chip, thereby reducing light loss and effectively improving light utilization efficiency of the chip. Furthermore, the spherical appearance surface enables the spherical light-emitting chip 10 to be more easily subject to adsorption, pick-up, and transfer, thereby improving a chip transfer yield.

The light-emitting layer 11 may be made of a material including, but not limited to, Gallium Nitride (GaN) or Indium Gallium Nitride (InGaN). The light-emitting layer 11 may be, but is not limited to, cylindrical. In the schematic diagram of the implementation, for example, the light-emitting layer 11 is cylindrical, and the light-emitting layer 11 can uniformly exit light in the spherical light-emitting chip 10. It can be understood that the light-emitting layer 11 may also be designed in other shapes, and the shape of the light-emitting layer 11 shall not be a limit to the spherical light-emitting chip 10 provided in the implementation. The light-emitting layer 11 may be, but is not limited to, arranged around the central axis 15 of the spherical light-emitting chip 10. In the schematic diagram of the implementation, for example, the light-emitting layer 11 is arranged around the central axis 15 of the spherical light-emitting chip 10, and the light-emitting layer 11 can uniformly exit light in the spherical light-emitting chip 10.

The first electrode 12 may be, but is not limited to, an N-type electrode. The first electrode 12 may be configured to load a voltage. The first electrode 12 may be made of a material including, but not limited to, Nickel (Ni)/Aurum (Au) or Chromium (Cr)/Platinum (Pt)/Aurum (Au). The first electrode 12 is spaced apart from the light-emitting layer 11, thereby reducing an adverse impact of the first electrode 12 on light-exiting efficiency of the light-emitting layer 11. The first electrode 12 may be, but is not limited to, arranged around a periphery of the light-emitting layer 11, which is conducive to providing stable voltage transmission in the spherical light-emitting chip 10. The first electrode 12 may, but is not limited to, form the appearance surface of the spherical light-emitting chip 10, thereby facilitating voltage transmission.

The second electrode 13 may be, but is not limited to, a P-type electrode. The second electrode 13 may be configured to load a voltage. The second electrode 13 may be made of a material including, but not limited to, Ni/Au or Cr/Pt/Au. The second electrode 13 is spaced apart from the light-emitting layer 11, thereby reducing an adverse impact of the second electrode 13 on the light-exiting efficiency of the light-emitting layer 11. The spherical light-emitting chip 10 has the central axis 15 passing through the sphere center of the spherical light-emitting chip 10. The second electrode 13 may extend in the direction of the central axis 15, and the central axis 15 passes through the second electrode 13. The second electrode 13 may be, but is not limited to, arranged around the central axis 15. In the schematic diagram of the implementation, for example, the second electrode 13 is arranged around the central axis 15, which is conducive for the second electrode 13 to transmit uniformly a voltage to the light-emitting layer 11. The second electrode 13 may be, but is not limited to, cylindrical or substantially cylindrical. In the schematic diagram of the implementation, for example, the second electrode 13 is substantially cylindrical. It can be understood that the second electrode 13 may also be designed in other shapes, and the shape of the second electrode 13 shall not be a limit to the spherical light-emitting chip 10 provided in the implementation. The second electrode 13 and the first electrode 12 are configured to load a voltage. The second electrode 13 may be, but is not limited to, connected to the P-type semiconductor, and the first electrode 12 may be, but is not limited to, connected to the N-type semiconductor, so that electrons in the N-type semiconductor and holes in the P-type semiconductor collide and recombine in the light-emitting layer 11 to generate photons, thereby enabling the light-emitting layer 11 to emit light.

The alignment guiding layer 14 may be, but is not limited to, formed by charged particles, and precise transferring and alignment of the spherical light-emitting chip 10 are achieved through electrostatic adsorption. A main principle of electrostatic adsorption transfer is that charges of the same polarity repel each other, and charges of different polarities attract each other, and thus adsorption and transferring of the spherical light-emitting chip 10 are achieved based on the principle. Specifically, a transfer target substrate 60 of the spherical light-emitting chip 10 may be, but is not limited to, a component configured to cooperate with the alignment guiding layer 14. When the alignment guiding layer 14 of the spherical light-emitting chip 10 consists of positively charged particles, a component consisting of negatively charged particles is disposed on the transfer target substrate 60 of the spherical light-emitting chip 10. When the alignment guiding layer 14 of the spherical light-emitting chip 10 consists of negatively charged particles, a component consisting of positively charged particles is disposed on the transfer target substrate 60 of the spherical light-emitting chip 10. During transferring of the spherical light-emitting chip 10, a movement posture of the spherical light-emitting chip 10 during transferring is adjusted under an electrostatic adsorption force generated by the alignment guiding layer 14, so that electrodes of the spherical light-emitting chip 10 can be in one-to-one correspondence with electrodes of the target substrate 60. The alignment guiding layer 14 may also be made of a magnetic material, for example, an electrical steel, a rare earth alloy, a metal alloy, or a ferrite material. The transfer target substrate 60 of the spherical light-emitting chip 10 may be, but is not limited to, a component having a magnetic performance, and thus precise alignment and transferring of the spherical light-emitting chip 10 can be achieved through magnetic adsorption. The alignment guiding layer 14 is arranged around the second electrode 13, and the surface of the alignment guiding layer 14 surrounding the second electrode 13 is in contact with a peripheral side surface 112 of the second electrode 13, so that the alignment guiding layer 14 as a whole is arranged close to the central axis 15 of the spherical light-emitting chip 10. Therefore, the spherical light-emitting chip 10 is subject to more stable adsorption during transferring, and imprecise alignment of the spherical light-emitting chip 10 caused by a dispersed adsorption force during transferring can be effectively reduced.

In summary, the spherical light-emitting chip 10 includes the light-emitting layer 11, the first electrode 12, the second electrode 13, and the alignment guiding layer 14. The spherical light-emitting chip 10 has the central axis 15 passing through the sphere center of the spherical light-emitting chip 10. The second electrode 13 extends in the direction of the central axis 15, and the central axis 15 passes through the second electrode 13. The alignment guiding layer 14 is arranged around the second electrode 13, and the surface of the alignment guiding layer 14 surrounding the second electrode 13 is in contact with the peripheral side surface 112 of the second electrode 13. During transferring of the spherical light-emitting chip 10, the spherical light-emitting chip 10 can be precisely transferred to the target position under the guidance of the alignment guiding layer 14, and the alignment guiding layer 14 as a whole is arranged close to the central axis 15 of the spherical light-emitting chip 10, so that the spherical light-emitting chip 10 is more stable in alignment, thereby effectively improving transfer precision and transferring efficiency of the spherical light-emitting chip 10.

Referring to FIGS. 1 and 2 again, the light-emitting layer 11 has a light-exiting surface 111 and a peripheral side surface 112. The peripheral side surface 112 of the light-emitting layer 11 is connected to the light-exiting surface 111 in a bent manner and is arranged around the light-exiting surface 111. The second electrode 13 is disposed at a side of the light-emitting layer 11 away from the light-exiting surface 111.

The light-exiting surface 111 may be, but is not limited to, a flat or substantially flat surface, thereby facilitating the light-emitting layer 11 to exit uniform light. The peripheral side surface 112 may be, but is not limited to, a flat or substantially flat surface, thereby facilitating implementations of a process of the light-emitting layer 11. The peripheral side surface 112 is connected to the light-exiting surface 111 in the bent manner, and a bend angle defined between the peripheral side surface 112 and the light-exiting surface 111 may be of, but is not limited to, 90° or approximately 90°. In the schematic diagram provided in the implementation, for example, the bend angle defined between the peripheral side surface 112 and the light-exiting surface 111 is of 90°, thereby facilitating manufacturing of the light-emitting layer 11. The light-exiting surface 111 may be, but is not limited to, a circular plane. In the schematic diagram of the implementation, for example, the light-exiting surface 111 is a circular plane, so that the light-emitting layer 11 can provide a uniform light-exiting effect in the spherical light-emitting chip 10. The peripheral side surface 112 is arranged around the light-exiting surface 111, and the peripheral side surface 112 may be, but is not limited to, arranged around the light-exiting surface 111 to define a cylindrical structure, thereby facilitating implementations of flows of the process of the light-emitting layer 11.

The second electrode 13 is disposed at the side of the light-emitting layer 11 away from the light-exiting surface 111, so that a light-exiting area of the light-emitting layer 11 is not reduced, and thus the spherical light-emitting chip 10 can provide a good light-exiting effect.

Referring to FIGS. 1 and 2 again, the alignment guiding layer 14 is disposed at an end of the second electrode 13 away from the light-emitting layer 11, and the alignment guiding layer 14 forms part of an appearance surface of the spherical light-emitting chip 10.

The alignment guiding layer 14 is disposed at the end of the second electrode 13 away from the light-emitting layer 11, that is, the alignment guiding layer 14 is designed to be close to the appearance surface of the spherical light-emitting chip 10, thereby facilitating alignment of the spherical light-emitting chip 10 during transferring. The alignment guiding layer 14 forms part of the appearance surface of the spherical light-emitting chip 10, thereby facilitating alignment of the spherical light-emitting chip 10 during transferring. Compared with a spherical light-emitting chip 10 in which the alignment guiding layer 14 is disposed, the spherical light-emitting chip 10 herein has a stronger adhesive force, and thus the spherical light-emitting chip 10 can be subject to more stable adsorption during transferring.

Referring to FIGS. 1 and 2 again, the first electrode 12 is arranged around the peripheral side surface 112 of the light-emitting layer 11.

The first electrode 12 is arranged around the peripheral side surface 112 of the light-emitting layer 11, thereby not blocking light exited from the light-exiting surface 111 of the light-emitting layer 11, and thus maximizing the light-exiting area of the spherical light-emitting chip 10, and enabling the spherical light-emitting chip 10 to provide a good light-exiting effect.

Figure 3:
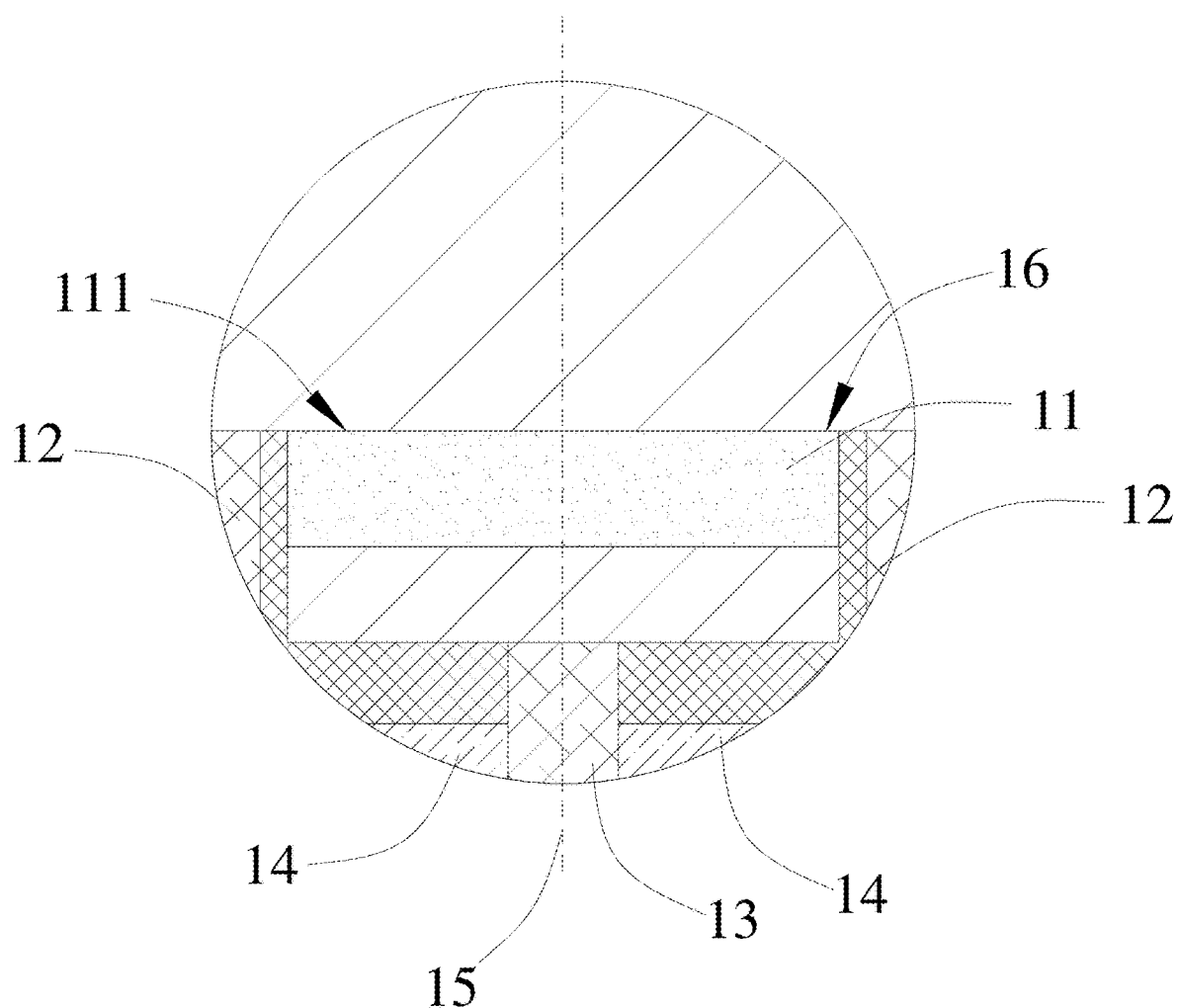
FIG. 3 is a schematic cross-sectional structural view of a spherical light-emitting chip in an implementation of the disclosure, taken along line A-A.

Referring to FIGS. 1, 2, and 3, FIG. 3 is a schematic cross-sectional structural view of a spherical light-emitting chip in an implementation of the disclosure, taken along line A-A. The spherical light-emitting chip 10 has a sphere-center plane 16 passing through the sphere center of the spherical light-emitting chip 10. The light-emitting layer 11 is disposed on the sphere-center plane 16 of the spherical light-emitting chip 10, and the sphere-center plane 16 is perpendicular to the central axis 15.

The spherical light-emitting chip 10 has the sphere-center plane 16 passing through the sphere center of the spherical light-emitting chip 10. In the schematic diagram of the implementation, for example, the sphere-center plane 16 is perpendicular to the central axis 15. The light-emitting layer 11 is disposed on the sphere-center plane 16 of the spherical light-emitting chip 10. The light-emitting layer 11 may, but is not limited to, partially penetrate the sphere-center plane 16, or the light-exiting surface 111 of the light-emitting layer 11 may be, but is not limited to, in contact with the sphere-center plane 16. In the schematic diagram of the implementation, for example, the light-exiting surface 111 of the light-emitting layer 11 is in contact with the sphere-center plane 16 (referring to FIG. 3), which can maximize the light-exiting area of the spherical light-emitting chip 10, thereby enabling the spherical light-emitting chip 10 to have optimal light-exiting efficiency.

Referring to FIGS. 1 and 2 again, the spherical light-emitting chip 10 may further include a first semiconductor 17, a second semiconductor 18, and an insulation layer 19. The first semiconductor 17 covers and is in contact with the light-exiting surface 111 of the light-emitting layer 11. The first semiconductor 17 is in conduction with the first electrode 12. The second semiconductor 18 is disposed on a surface of the light-emitting layer 11 away from the light-exiting surface 111. The second semiconductor 18 is in conduction with the second electrode 13, and a peripheral side surface 112 of the second semiconductor 18 is spaced apart from the first electrode 12. The insulation layer 19 may include a first insulation portion 191 and a second insulation portion 192 connected to the first insulation portion 191. The first insulation portion 191 is disposed at a periphery of the second insulation portion 192 and is connected to the second insulation portion 192 in a bent manner. One end of the first insulation portion 191 away from the second insulation portion 192 is arranged between the peripheral side surface 112 of the light-emitting layer 11 and the first electrode 12, and the other end of the first insulation portion 191 adjacent to the second insulation portion 192 is arranged between the peripheral side surface 112 of the second semiconductor 18 and the first electrode 12. The second insulation portion 192 surrounds the second electrode 13 and is arranged between the alignment guiding layer 14 and the second semiconductor 18.

The first semiconductor 17 may be, but is not limited to, an N-type semiconductor, and the first semiconductor 17 can inject electrons into the light-emitting layer 11. The first semiconductor 17 may be made of a material including, but not limited to, Gallium Phosphide (GaP), Indium Phosphide (InP), Indium Nitride (InN), or GaN. The first semiconductor 17 is in conduction with the first electrode 12, and the first semiconductor 17 can diffuse electrons to the light-emitting layer 11 under a voltage applied by the first electrode 12. The first semiconductor 17 may be, but is not limited to, hemispherical. In the schematic diagram of the implementation, for example, the first semiconductor 17 is hemispherical. The first semiconductor 17 covers and is in contact with the light-exiting surface 111 of the light-emitting layer 11, so that the first semiconductor 17 can uniformly diffuse electrons to the light-emitting layer 11.

The second semiconductor 18 may be, but is not limited to, a P-type semiconductor, and the second semiconductor 18 can inject holes into the light-emitting layer 11. The second semiconductor 18 may be made of a material including, but not limited to, GaP, InP, InN, or GaN. The second semiconductor 18 is in conduction with the second electrode 13, and the second semiconductor 18 can diffuse holes to the light-emitting layer 11 under a voltage applied by the second electrode 13. Under the voltages applied, the electrons of the first semiconductor 17 are diffused to the light-emitting layer 11, the holes of the second semiconductor 18 are diffused to the light-emitting layer 11, and the electrons and the holes are recombined in the light-emitting layer 11 to generate recombined energy, and release the recombined energy through light emission, so that the spherical light-emitting chip 10 performs light exiting. The second semiconductor 18 may be, but is not limited to, cylindrical. In the schematic diagram of the implementation, for example, the second semiconductor 18 is cylindrical. The second semiconductor 18 is disposed on the surface of the light-emitting layer 11 away from the light-exiting surface 111. The second semiconductor 18 may be, but is not limited to, in contact with the surface of the light-emitting layer 11 away from the light-exiting surface 111, which is conducive for the second semiconductor 18 to uniformly diffuse holes to the light-emitting layer 11. The peripheral side surface 112 of the second semiconductor 18 is spaced apart from the first electrode 12, thereby avoiding interference of the voltage applied by the first electrode 12 on normal operation of the second semiconductor 18, and further ensuring a normal light-exiting effect and operation of the spherical light-emitting chip 10.

The insulation layer 19 may include a first insulation portion 191 and a second insulation portion 192 connected to the first insulation portion 191. The first insulation portion 191 and the second insulation portion 192 may be, but are not limited to, integrally formed. In the schematic diagram of the implementation, for example, the first insulation portion 191 and the second insulation portion 192 are integrally formed, thereby facilitating design and implementation of processes. The first insulation portion 191 is disposed at a periphery of the second insulation portion 192 and is connected to the second insulation portion 192 in a bent manner. A bend angle defined between the first insulation 191 and the second insulation 192 may be of, but is not limited to, 90° or approximately 90°. In the schematic diagram provided in the implementation, for example, the bend angle defined between the first insulation element 191 and the second insulation element 192 is of 90°. It can be understood that the bend angle defined between the first insulation element 191 and the second insulation element 192 may be of other degrees, which shall not be a limit to the spherical light-emitting chip 10 provided in the implementation. The first insulation portion 191 may be, but is not limited to, arranged around the light-emitting layer 11 and the second semiconductor 18. In the schematic diagram of the implementation, for example, the first insulation portion 191 is arranged around the light-emitting layer 11 and the second semiconductor 18. One end of the first insulation portion 191 away from the second insulation portion 192 is arranged between the peripheral side surface 112 of the light-emitting layer 11 and the first electrode 12, thereby reducing an adverse impact of the first electrode 12 on the light-exiting efficiency of the light-emitting layer 11. The end of the first insulation portion 191 away from the second insulation portion 192 may be, but is not limited to, in contact with the light-emitting layer 11 and the first electrode 12, which is conducive for implementation of process design while a good insulation effect is ensured. The other end of the first insulation portion 191 adjacent to the second insulation portion 192 is arranged between the peripheral side surface 112 of the second semiconductor 18 and the first electrode 12, thereby avoiding an adverse impact of the first electrode 12 on normal operation of the second semiconductor 18. The other end of the first insulation portion 191 adjacent to the second insulation portion 192 may be, but is not limited to, in contact with the second semiconductor 18 and the first electrode 12, which is conducive for implementation of process design while a good insulation effect is ensured. The second insulation portion 192 is arranged around the second electrode 13, and the second insulation portion 192 may be, but is not limited to, in contact with a surface of the second electrode 13. The second insulation portion 192 is arranged between the alignment guiding layer 14 and the second semiconductor 18, thereby avoiding interference between the alignment guiding layer 14 and the second semiconductor 18, and further ensuring a transfer yield and normal operation of the spherical light-emitting chip 10.

Figure 4:
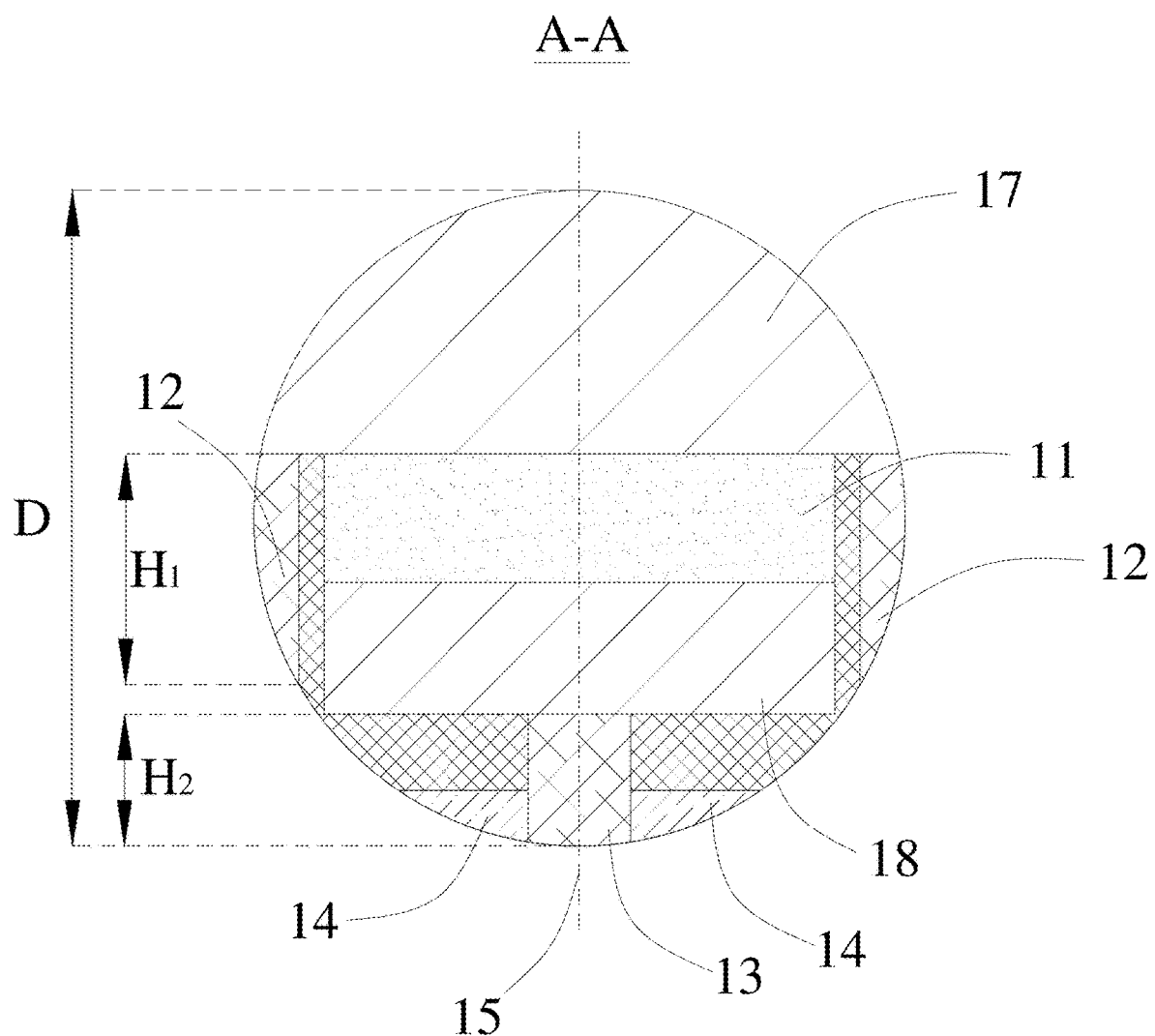
FIG. 4 is a schematic cross-sectional structural view of a spherical light-emitting chip in an implementation of the disclosure, taken along line A-A.

Referring to FIG. 4, FIG. 4 is a schematic cross-sectional structural view of a spherical light-emitting chip in an implementation of the disclosure, taken along line A-A. The spherical light-emitting chip 10 has a diameter D. A height $H_1$ of the first electrode 12 along the central axis 15 satisfies: $H_1<0.5*D$. A height $H_2$ of the second electrode 13 along the central axis 15 satisfies $H_2<0.5*D$.

The height $H_1$ of the first electrode 12 along the central axis 15 may be, but is not limited to, $0.3*D$, $0.2*D$, or $0.4*D$, as long as $H_1<0.5*D$ is satisfied. When the height $H_1$ satisfies: $H_1<0.5*D$, it is convenient for processing and manufacturing of an electrode layer, a ratio of a volume of the electrode layer to a volume of the light-emitting chip and a ratio of a volume of the electrode layer to a volume of a device where the spherical light-emitting chip 10 is applied are reduced, and maximum light-exiting efficiency of the spherical light-emitting chip 10 and maximum light-exiting efficiency of the device where the spherical light-emitting chip 10 is applied are ensured.

The height $H_2$ of the second electrode 13 along the central axis 15 may be, but is not limited to, $0.3*D$, $0.2*D$, or $0.4*D$, as long as $H_2<0.5*D$ is satisfied. When the height $H_2$ satisfies: $H_2<0.5*D$, it is convenient for processing and manufacturing of the electrode layer, the ratio of the volume of the electrode layer to the volume of the light-emitting chip and the ratio of the volume of the electrode layer to the volume of the device where the spherical light-emitting chip 10 is applied are reduced, and the maximum light-exiting efficiency of the spherical light-emitting chip 10 and the maximum light-exiting efficiency of the device where the spherical light-emitting chip 10 is applied are ensured.

Figure 5:
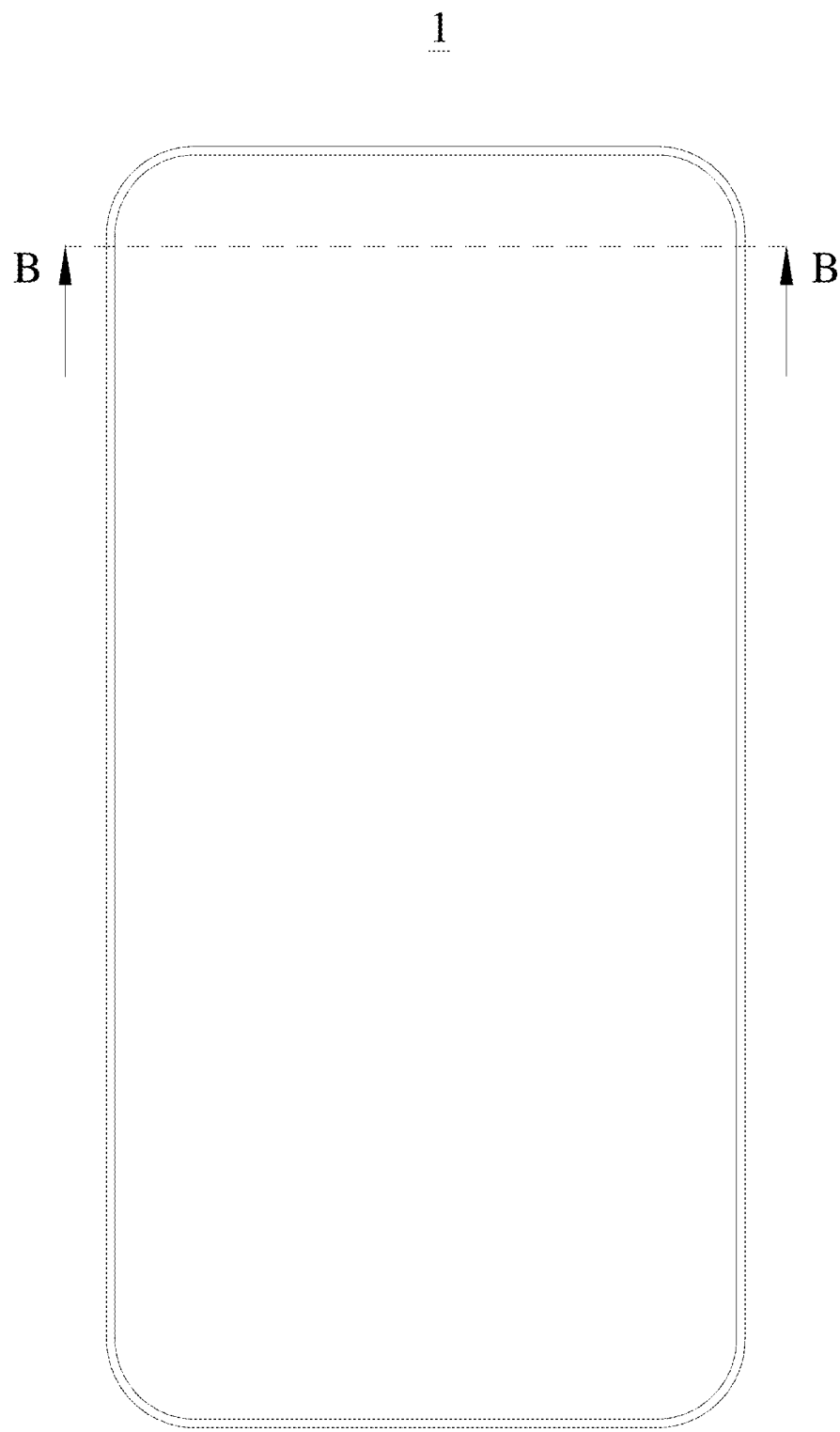
FIG. 5 is a schematic structural view of a display device in implementations of the disclosure.
Figure 6:
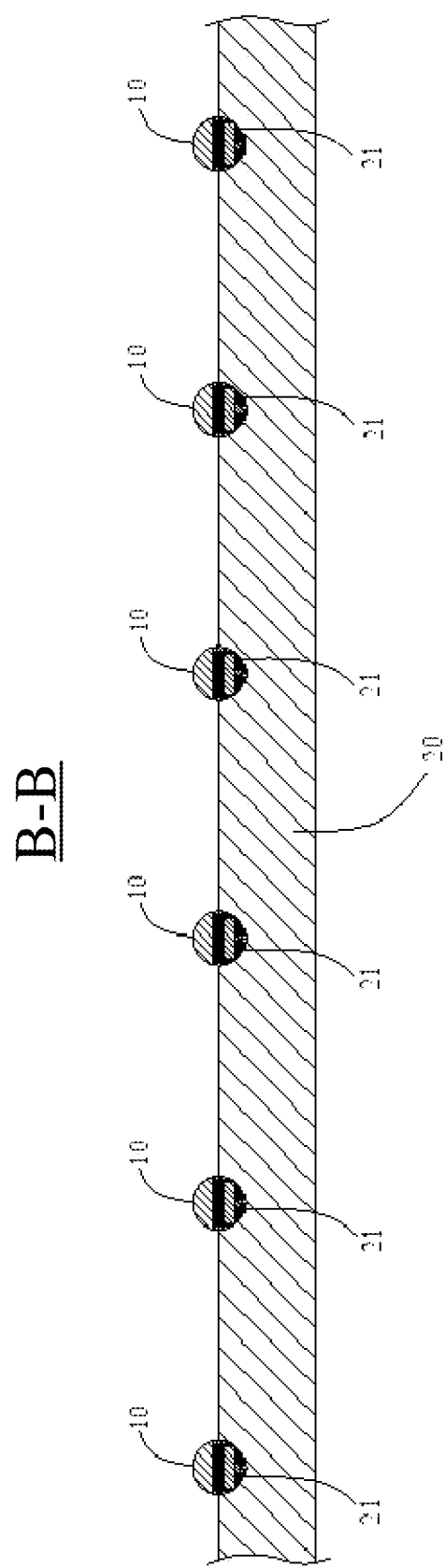
FIG. 6 is a schematic cross-sectional structural view of the display device provided in FIG. 5, taken along line B-B.
Figure 7:
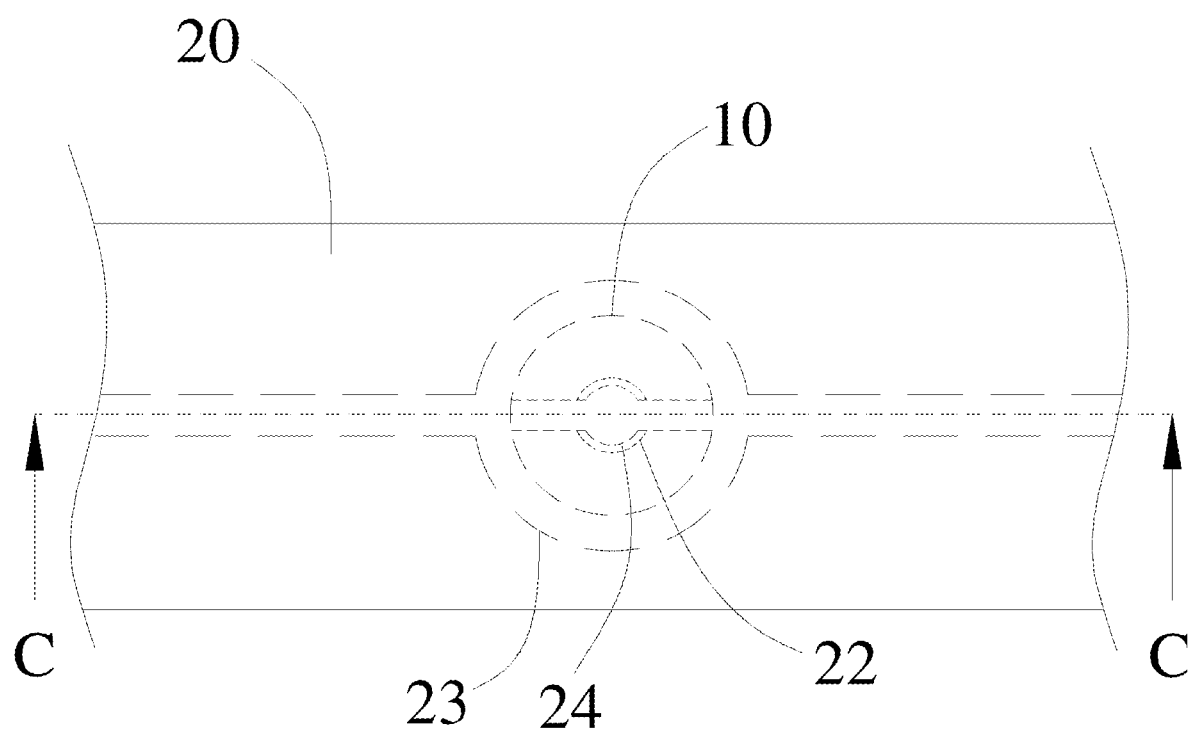
FIG. 7 is a schematic top view of a portion of a display device in an implementation of the disclosure.
Figure 8:
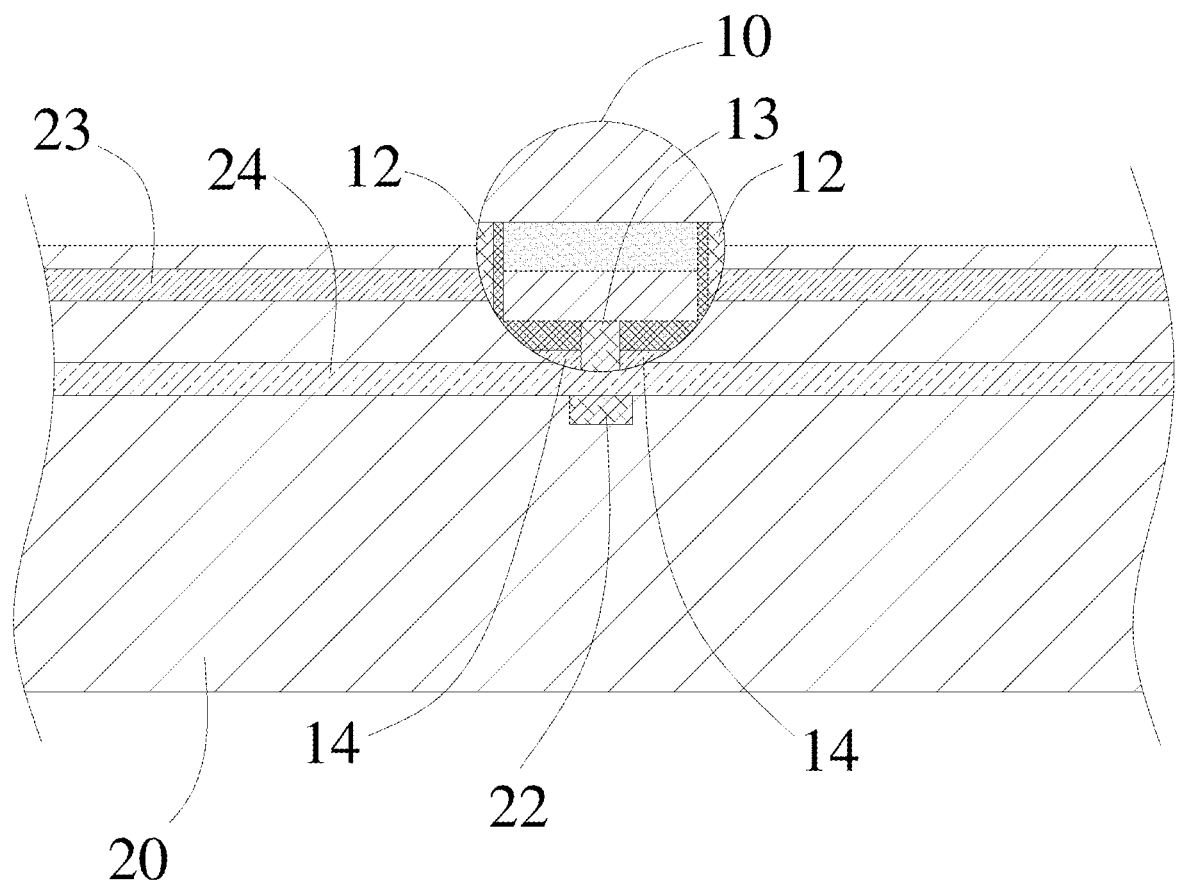
FIG. 8 is a schematic cross-sectional structural view of the display device provided in FIG. 7, taken along line C-C.

Referring to FIGS. 5, 6, 7, and 8, FIG. 5 is a schematic structural view of a display device in implementations of the disclosure, FIG. 6 is a schematic cross-sectional structural view of the display device provided in FIG. 5, taken along line B-B, FIG. 7 is a schematic top view of a portion of a display device in an implementation of the disclosure, and FIG. 8 is a schematic cross-sectional structural view of the display device provided in FIG. 7, taken along line C-C. A display device 1 is further provided in implementations of the disclosure. The display device 1 includes a display substrate 20 and the spherical light-emitting chip 10. The display substrate 20 defines multiple recesses 21 each configured to receive one spherical light-emitting chip 10.

The display device 1 may be, but is not limited to, a mobile phone, a watch, a tablet computer, a notebook computer, a television, or a portable electronic device. The display device 1 includes the display substrate 20 and the spherical light-emitting chip 10. The display device 1 may further include, but is not limited to, a power supply, a housing, or other components. It can be understood that other components of the display device 1 shall not be a limit to the display device 1 provided in the implementation.

Specifically, the display substrate 20 may be, but is not limited to, a Complementary Metal Oxide Semiconductor (CMOS) substrate, a Thin Film Transistor (TFT) substrate, or a Liquid Crystal on Silicon (LCOS) substrate. The display substrate 20 may be made of a semiconductor material including, but not limited to, silicon (Si), silicon carbide (SIC), GaN, germanium (Ge), gallium arsenide (GaAs), or InP. The display substrate 20 may be made of a non-conductive material including, but not limited to, glass or sapphire. The display substrate 20 may include, but is not limited to, a driving circuit, where the driving circuit may be configured to drive the spherical light-emitting chip 10. The driving circuit may be an active matrix driving circuit or a passive matrix driving circuit. The display substrate 20 may be configured to carry the spherical light-emitting chip 10 and drive the spherical light-emitting chip 10 to operate. The display substrate 20 may define the multiple recesses 21, where the recess 21 may be formed on a surface of the display substrate 20 and is configured to receive the spherical light-emitting chip 10, thereby facilitating limit of the spherical light-emitting chip 10 during transferring. The recess 21 and the spherical light-emitting chip 10 may be in one-to-one correspondence, that is, a single recess 21 receives a single spherical light-emitting chip 10, thereby facilitating precise limit of the spherical light-emitting chip 10. The recess 21 may be, but is not limited to, hemispherical. In the schematic diagram of the implementation, for example, the recess 21 is hemispherical and is in contact with the appearance surface of the spherical light-emitting chip 10, thereby facilitating reception and fixing of the spherical light-emitting chip 10. It can be understood that the recess 21 may also be designed in other shapes, and the shape of the recess 21 shall not be a limit to the display device 1 provided in the implementation.

The display substrate 20 may include, but is not limited to, a third electrode 23 and a fourth electrode 24. The third electrode 23 may be connected to the first electrode 12 and configured to transmit a voltage to the first electrode 12. The third electrode 23 may be, but is not limited to, partially of an annular shape. In the schematic diagram of the implementation, for example, the third electrode 23 is partially of an annular shape surrounding the spherical light-emitting chip 10, so that the third electrode 23 and the first electrode 12 can be connected uniformly, thereby ensuring stable voltage transmission between the third electrode 23 and the first electrode 12. The fourth electrode 24 may be connected to the second electrode 13 and configured to transmit a voltage to the second electrode 13. A projection of the fourth electrode 24 may be, but is not limited to, circular. In the schematic diagram of the implementation, for example, a projection of a connection between the fourth electrode 24 and the second electrode 13 is circular, thereby facilitating matching between a shape of the fourth electrode 24 and a shape of the second electrodes 13. In this way, the fourth electrode 24 and the second electrodes 13 can be connected uniformly, thereby ensuring stable voltage transmission between the fourth electrode 24 and the second electrode 13.

Referring to FIGS. 5, 6, 7 and 8 again, the display device 1 may include an alignment guiding member 22 disposed on the display substrate 20 and disposed corresponding to the recess 21. The alignment guiding member 22 is configured to position the spherical light-emitting chip 10 through attraction between the alignment guiding member 22 and the alignment guiding layer 14 of the spherical light-emitting chip 10.

The alignment guiding member 22 may be, but is not limited to, formed by charged particles, and precise transferring and alignment of the spherical light-emitting chip 10 are achieved through electrostatic adsorption. Specifically, when the alignment guiding layer 14 of the spherical light-emitting chip 10 consists of positively charged particles, the alignment guiding member 22 consists of negatively charged particles. When the alignment guiding layer 14 of the spherical light-emitting chip 10 consists of negatively charged particles, the alignment guiding member 22 consists of positively charged particles. During transferring of the spherical light-emitting chip 10, a movement posture of the spherical light-emitting chip 10 during transferring is adjusted under an electrostatic adsorption force generated between the alignment guiding layer 14 and the alignment guiding member 22, so that electrodes of the spherical light-emitting chip 10 can be in one-to-one correspondence with electrodes of the alignment guiding member 22. The alignment guiding member 22 may also be made of a magnetic material, for example, an electrical steel, a rare earth alloy, a metal alloy, or a ferrite material, and thus precise alignment and transferring of the spherical light-emitting chip 10 can be achieved through magnetic adsorption.

The alignment guiding member 22 is disposed on the display substrate 20 and disposed corresponding to the recess 21. The alignment guiding member 22 may be, but is not limited to, disposed at a bottom of the recess 21. In the schematic diagram of the implementation, for example, the alignment guiding member 22 is disposed at the bottom of the recess 21, thereby facilitating mutual cooperation between the alignment guiding member 22 and the alignment guiding layer 14 of the spherical light-emitting chip 10. The alignment guiding member 22 is configured to position the spherical light-emitting chip 10, thereby achieving precise transferring of the spherical light-emitting chip 10.

The alignment guiding layer 14 is arranged around the second electrode 13, and the surface of the alignment guiding layer 14 surrounding the second electrode 13 is in contact with the peripheral side surface 112 of the second electrode 13, so that the alignment guiding layer 14 as a whole is arranged close to the central axis 15 of the spherical light-emitting chip 10. Therefore, the spherical light-emitting chip 10 is subject to more stable adsorption during transferring, and imprecise alignment of the spherical light-emitting chip 10 caused by dispersed adsorption force during transferring can be effectively reduced.

Figure 9A:
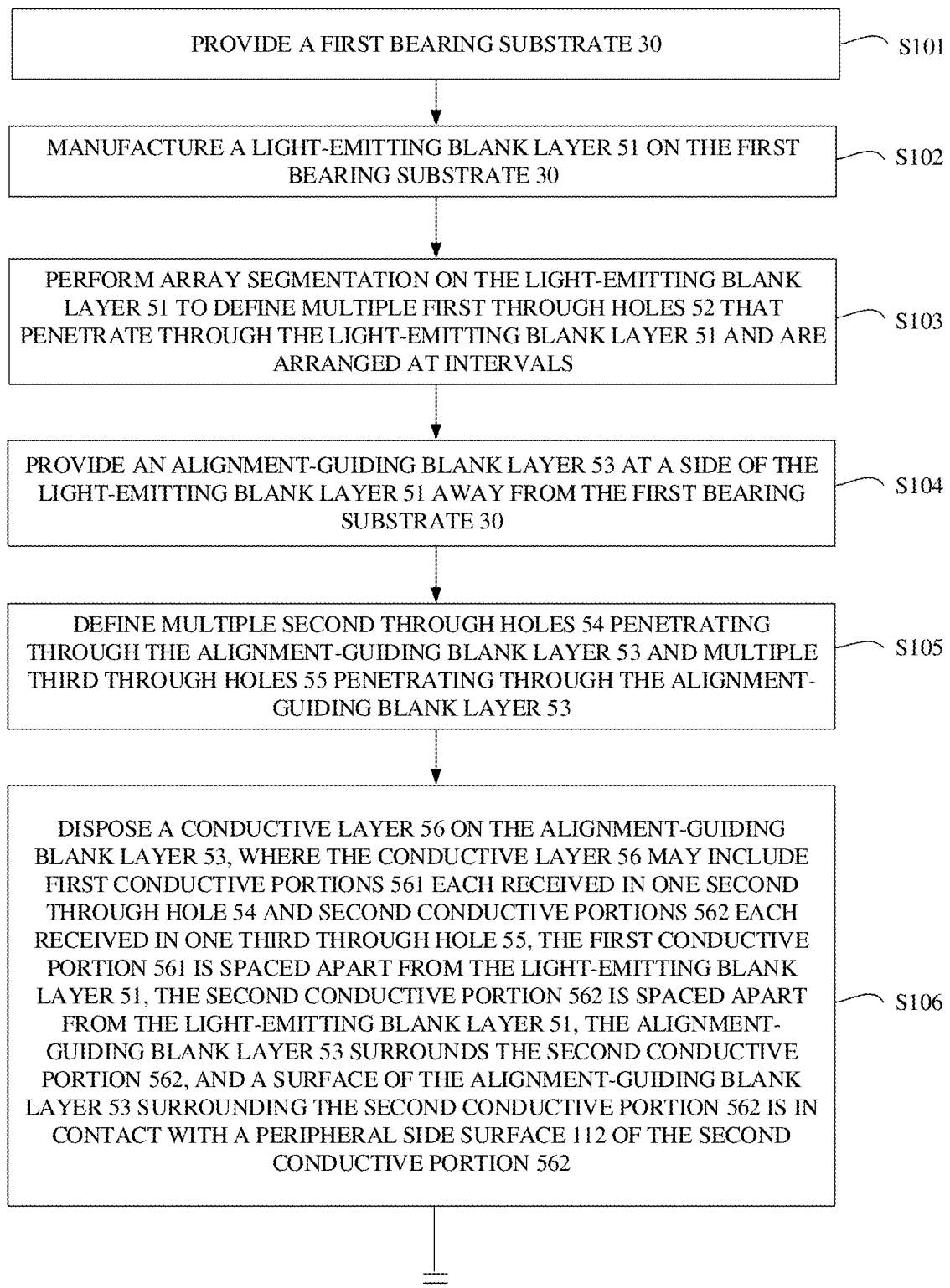
FIG. 9 is a schematic flow chart illustrating a manufacturing method of a spherical light-emitting chip in an implementation of the disclosure.
Figure 9B:
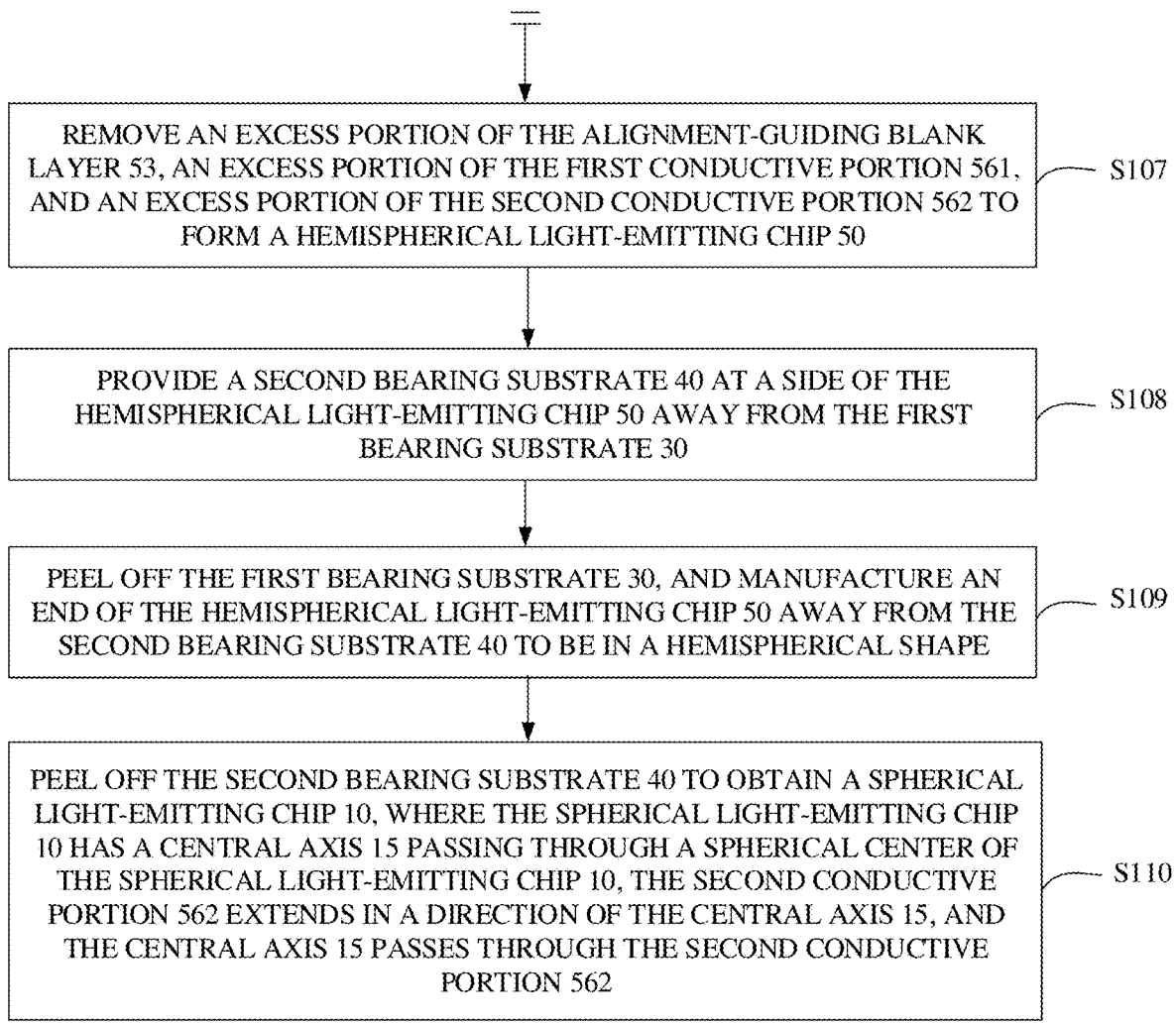
Figure 10A:
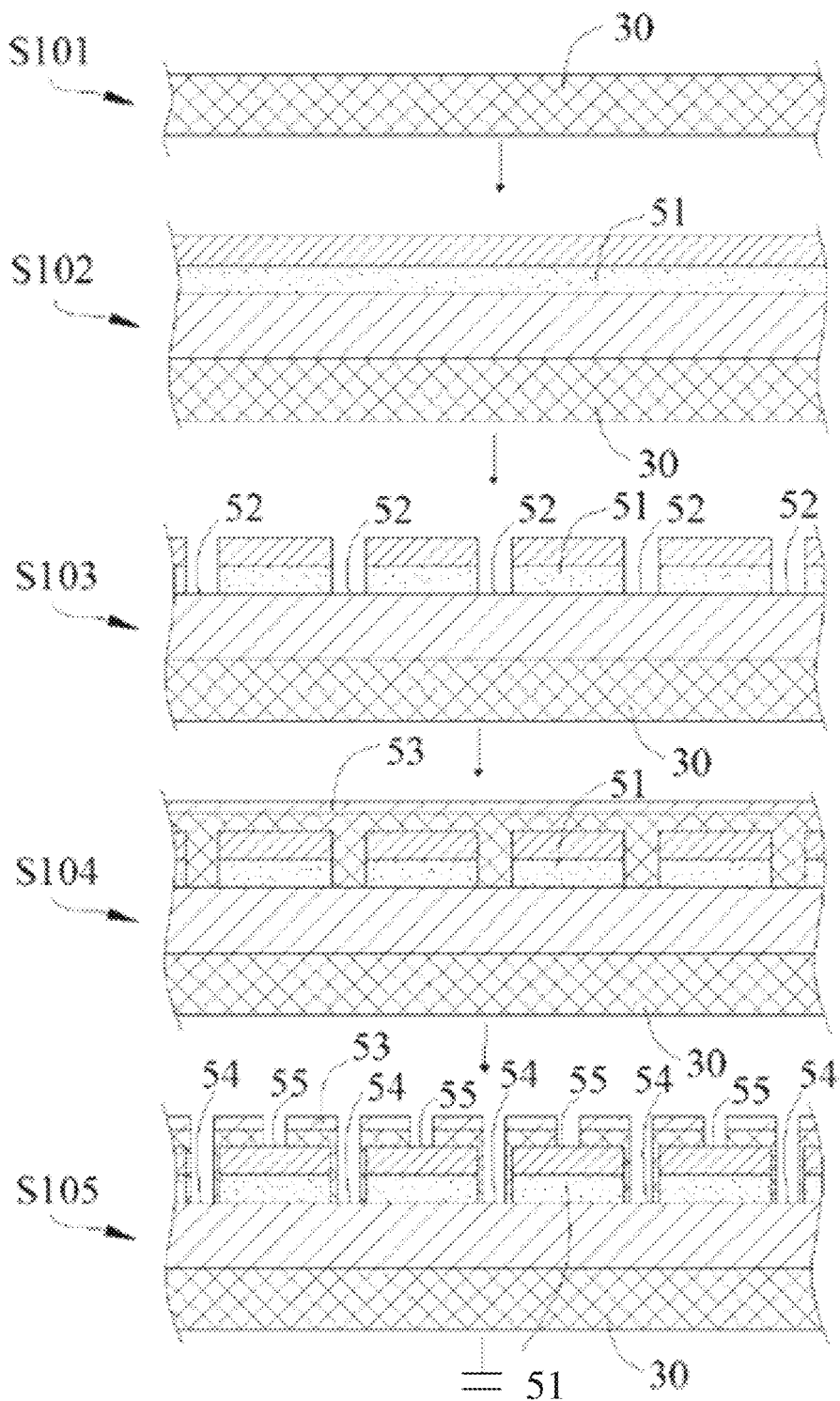
FIG. 10 is a schematic flow chart illustrating a manufacturing method of a spherical light-emitting chip in an implementation of the disclosure.
Figure 10B:
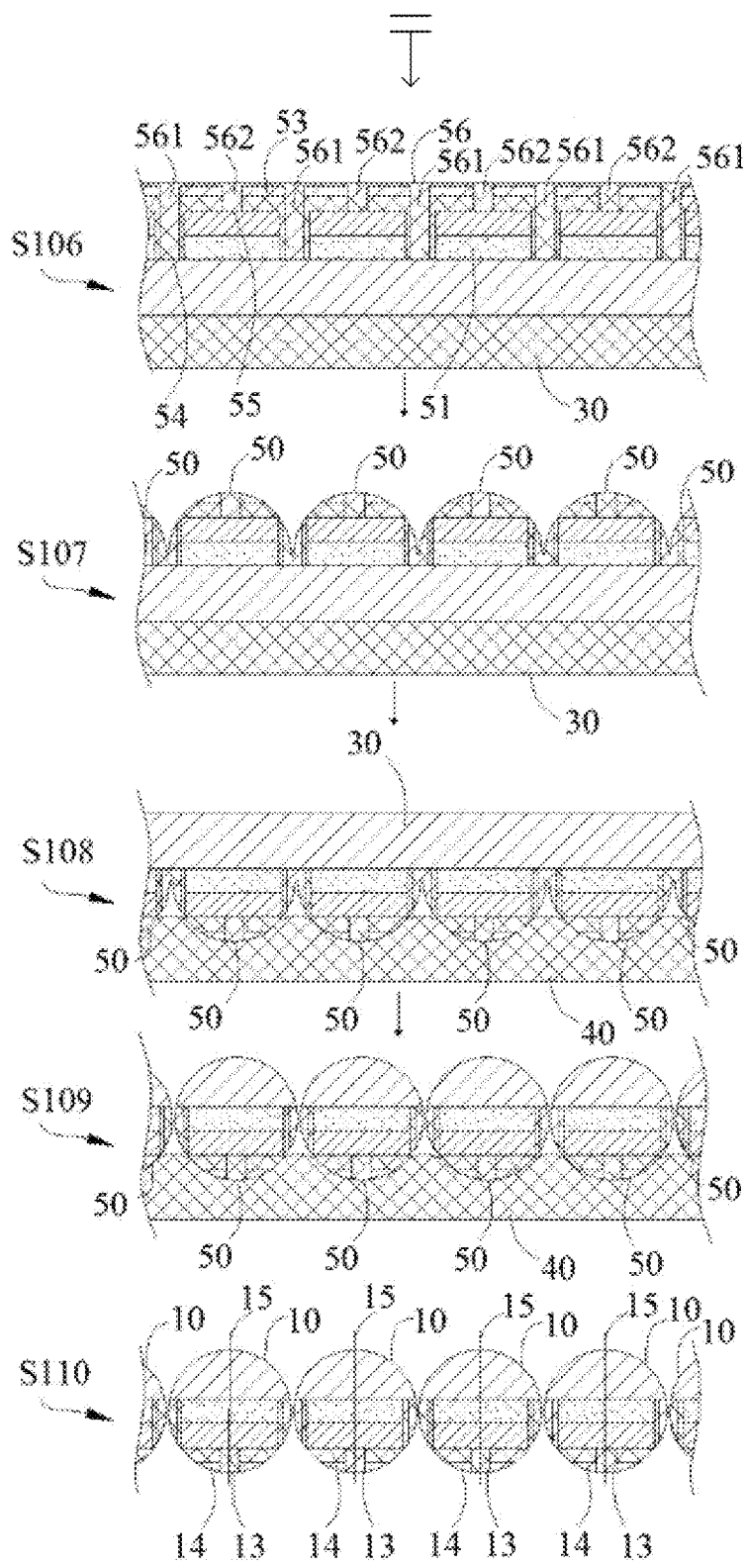
Figure 11A:
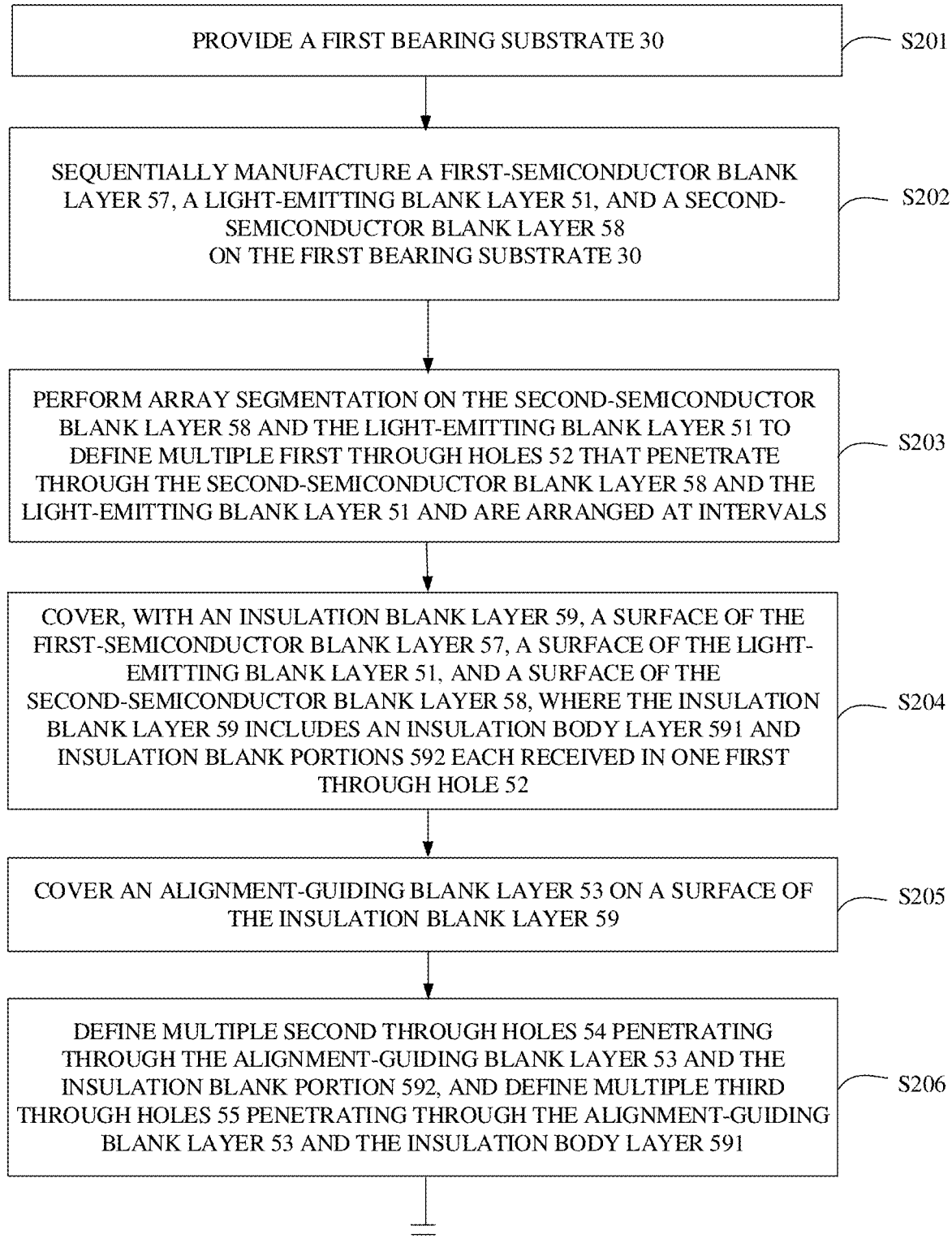
FIG. 11 is a schematic flow chart illustrating a manufacturing method of a spherical light-emitting chip in an implementation of the disclosure.
Figure 11B:
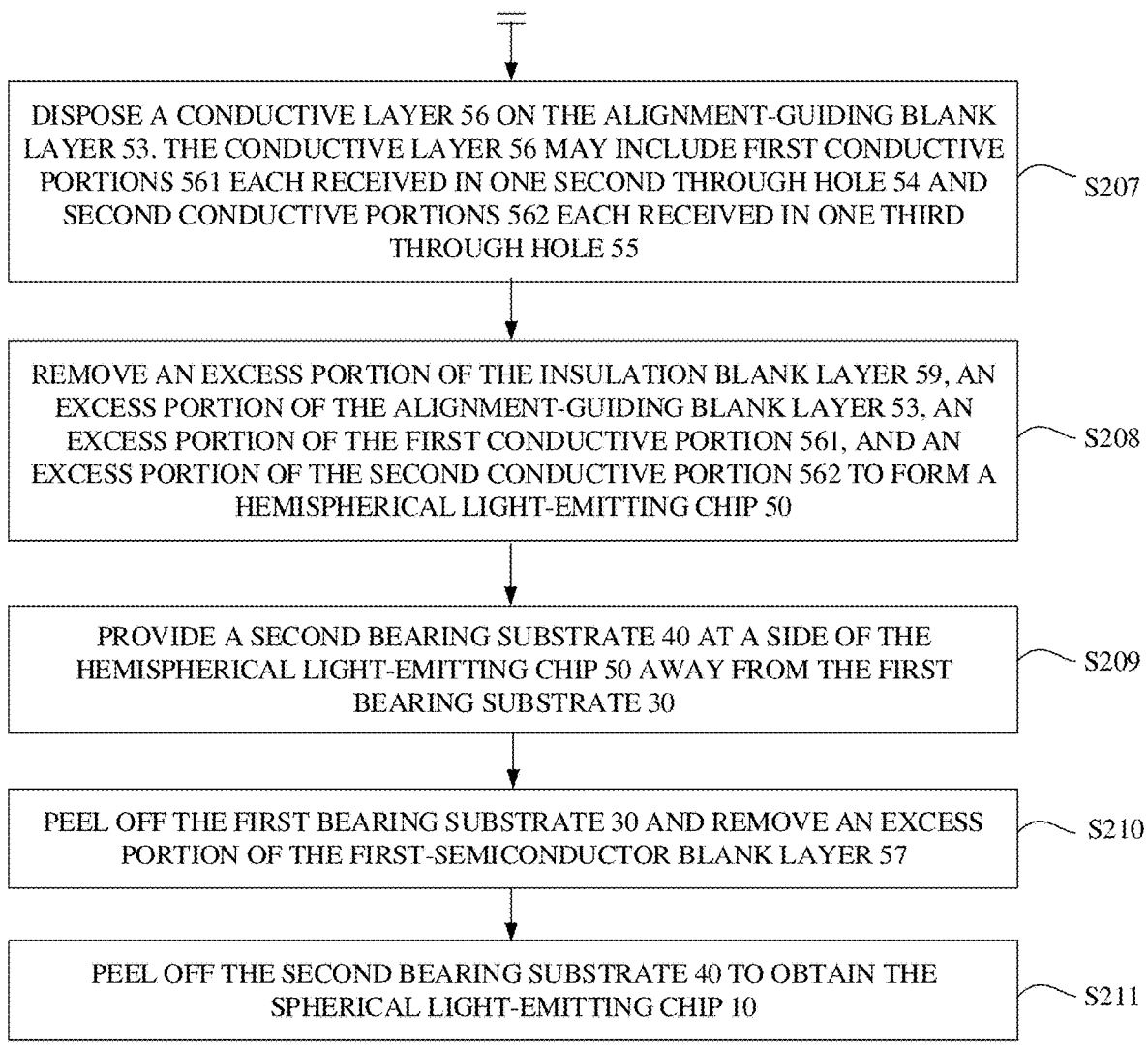

Referring to FIGS. 9 and 10, FIG. 9 is a schematic flow chart illustrating a manufacturing method of a spherical light-emitting chip in an implementation of the disclosure, and FIG. 10 is a schematic flow chart illustrating a manufacturing method of a spherical light-emitting chip in an implementation of the disclosure. The manufacturing method of the spherical light-emitting chip 10 includes operations at S101, S102, S103, S104, S105, S106, S107, S108, S109, and S110, and is described in detail as follows.

S101, provide a first bearing substrate 30.

S102, manufacture a light-emitting blank layer 51 on the first bearing substrate 30.

Specifically, the light-emitting blank layer 51 may be made of a material including, but not limited to, GaN or InGaN. The light-emitting blank layer 51 may be manufactured in a manner including, but not limited to, vapor deposition or evaporation. It can be understood that the light-emitting blank layer 51 may also be manufactured through other processes.

S103, perform array segmentation on the light-emitting blank layer 51 to define multiple first through holes 52 that penetrate through the light-emitting blank layer 51 and are arranged at intervals.

Specifically, the array segmentation on the light-emitting blank layer 51 may be implemented in a manner including, but not limited to, laser. The first through hole 52 penetrates through the light-emitting blank layer 51. The first through hole 52 may be in a shape including, but not limited to, a cuboid or a similar cuboid. It can be understood that the shape of the first through hole 52 shall not be a limit to the first through hole 52 provided in the implementation. The first through holes 52 are arranged at intervals, and the first through holes 52 may be spaced apart from each other by a same distance or different distances.

S104, provide an alignment-guiding blank layer 53 at a side of the light-emitting blank layer 51 away from the first bearing substrate 30.

Specifically, the alignment-guiding blank layer 53 may be, but is not limited to, formed by charged particles, and precise transferring and alignment of the spherical light-emitting chip 10 are achieved through electrostatic adsorption. The alignment-guiding blank layer 53 may also be made of a magnetic material, for example, an electrical steel, a rare earth alloy, a metal alloy, or a ferrite material, and thus precise alignment and transferring of the spherical light-emitting chip 10 can be achieved through magnetic adsorption. The alignment-guiding blank layer 53 is disposed at the side of the light-emitting blank layer 51 away from the first bearing substrate 30. The alignment-guiding blank layer 53 may be spaced apart from the light-emitting blank layer 51, so as to avoid an adverse impact on light-emitting efficiency of the light-emitting blank layer 51.

S105, define multiple second through holes 54 penetrating through the alignment-guiding blank layer 53 and multiple third through holes 55 penetrating through the alignment-guiding blank layer 53.

Specifically, the second through hole 54 may be defined in a manner including, but not limited to, etching. The second through hole 54 may penetrate through the alignment-guiding blank layer 53.

The third through hole 55 may be defined in a manner including, but not limited to, etching. The third through hole 55 may penetrate through the alignment-guiding blank layer 53.

S106, dispose a conductive layer 56 on the alignment-guiding blank layer 53. The conductive layer 56 may include first conductive portions 561 each received in one second through hole 54 and second conductive portions 562 each received in one third through hole 55. The first conductive portion 561 is spaced apart from the light-emitting blank layer 51, and the second conductive portion 562 is spaced apart from the light-emitting blank layer 51. The alignment-guiding blank layer 53 surrounds the second conductive portion 562, and a surface of the alignment-guiding blank layer 53 surrounding the second conductive portion 562 is in contact with a peripheral side surface 112 of the second conductive portion 562.

Specifically, the conductive layer 56 may be formed on the alignment-guiding blank layer 53 in a manner including, but not limited to, vapor deposition or evaporation. The conductive layer 56 may be made of a material including, but not limited to, Ni/Au or Cr/Pt/Au. The conductive layer 56 includes the first conductive portion 561 each received in one second through hole 54 and the second conductive portions 562 each received in one third through hole 55. The first conductive portion 561 is spaced apart from the light-emitting blank layer 51, thereby avoiding interference of the first conductive portion 561 on the light-emitting efficiency of the light-emitting blank layer 51. The second conductive portion 562 is spaced apart from the light-emitting blank layer 51, thereby avoiding interference of the second conductive portion 562 on the light-emitting efficiency of the light-emitting blank layer 51. The alignment-guiding blank layer 53 may be arranged around the second conductive portion 562, and the surface of the alignment-guiding blank layer 53 surrounding the second conductive portion 562 may be in contact with the peripheral side 112 of the second conductive portion 562, so that the alignment guiding layer 14 as a whole is arranged close to the center of the spherical light-emitting chip 10, and thus the spherical light-emitting chip 10 is subject to more stable adsorption during transferring.

S107, remove an excess portion of the alignment-guiding blank layer 53, an excess portion of the first conductive portion 561, and an excess portion of the second conductive portion 562 to form a hemispherical light-emitting chip 50.

Specifically, the excess portion of the alignment-guiding blank layer 53, the excess portion of the first conductive portion 561, and the excess portion of the second conductive portion 562 may be removed in a manner including, but not limited to, etching, to form the hemispherical light-emitting chip 50.

S108, provide a second bearing substrate 40 at a side of the hemispherical light-emitting chip 50 away from the first bearing substrate 30.

Specifically, the second bearing substrate 40 may be disposed at the side of the hemispherical light-emitting chip 50 away from the first bearing substrate 30, and the second bearing substrate 40 may be, but is not limited to, in contact with a hemispherical surface of the hemispherical light-emitting chip 50.

S109, peel off the first bearing substrate 30, and manufacture an end of the hemispherical light-emitting chip 50 away from the second bearing substrate 40 to be in a hemispherical shape.

Specifically, the first bearing substrate 30 may be peeled off in a manner including, but not limited to, development stripping, and the end of the hemispherical light-emitting chip 50 away from the second bearing substrate 40 is manufactured to be in the hemispherical shape.

S110, peel off the second bearing substrate 40 to obtain a spherical light-emitting chip 10. The spherical light-emitting chip 10 has a central axis 15 passing through a spherical center of the spherical light-emitting chip 10. The second conductive portion 562 extends in a direction of the central axis 15, and the central axis 15 passes through the second conductive portion 562.

Specifically, the second bearing substrate 40 may be peeled off in a manner including, but not limited to, development stripping, to obtain the spherical light-emitting chip 10. The spherical light-emitting chip 10 has the central axis 15 passing through the sphere center of the spherical light-emitting chip 10. The second conductive portion 562 extends in the direction of the central axis 15, and the central axis 15 passes through the second conductive portion 562. During transferring of the spherical light-emitting chip 10, the spherical light-emitting chip 10 can be precisely transferred to a target position under the guidance of the alignment guiding layer 14, and the alignment guiding layer 14 as a whole is arranged close to the central axis 15 of the spherical light-emitting chip 10, so that the spherical light-emitting chip 10 is more stable in alignment, thereby effectively improving transferring precision and transferring efficiency of the spherical light-emitting chip 10.

Figure 12A:
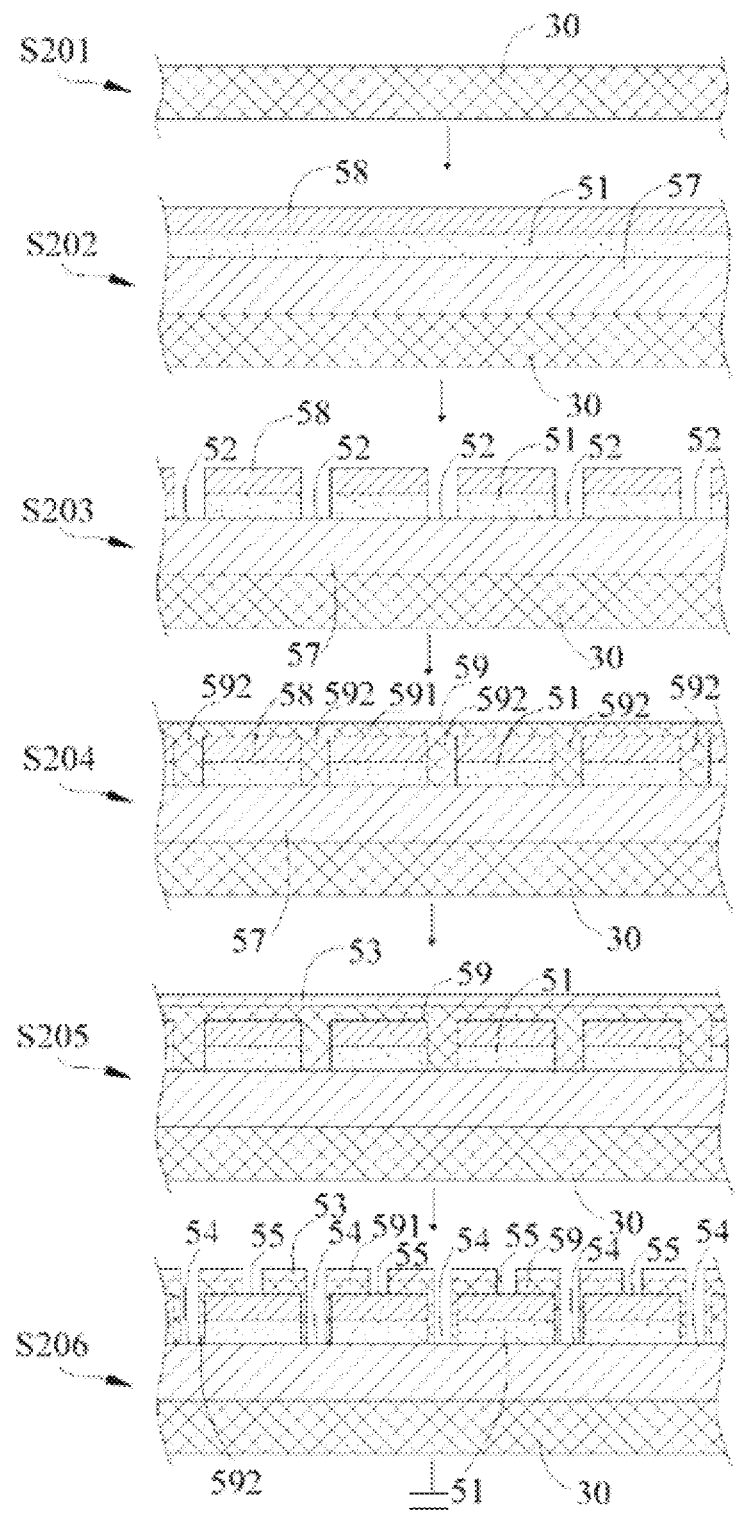
FIG. 12 is a schematic flow chart illustrating a manufacturing method of a spherical light-emitting chip in an implementation of the disclosure.
Figure 12B:
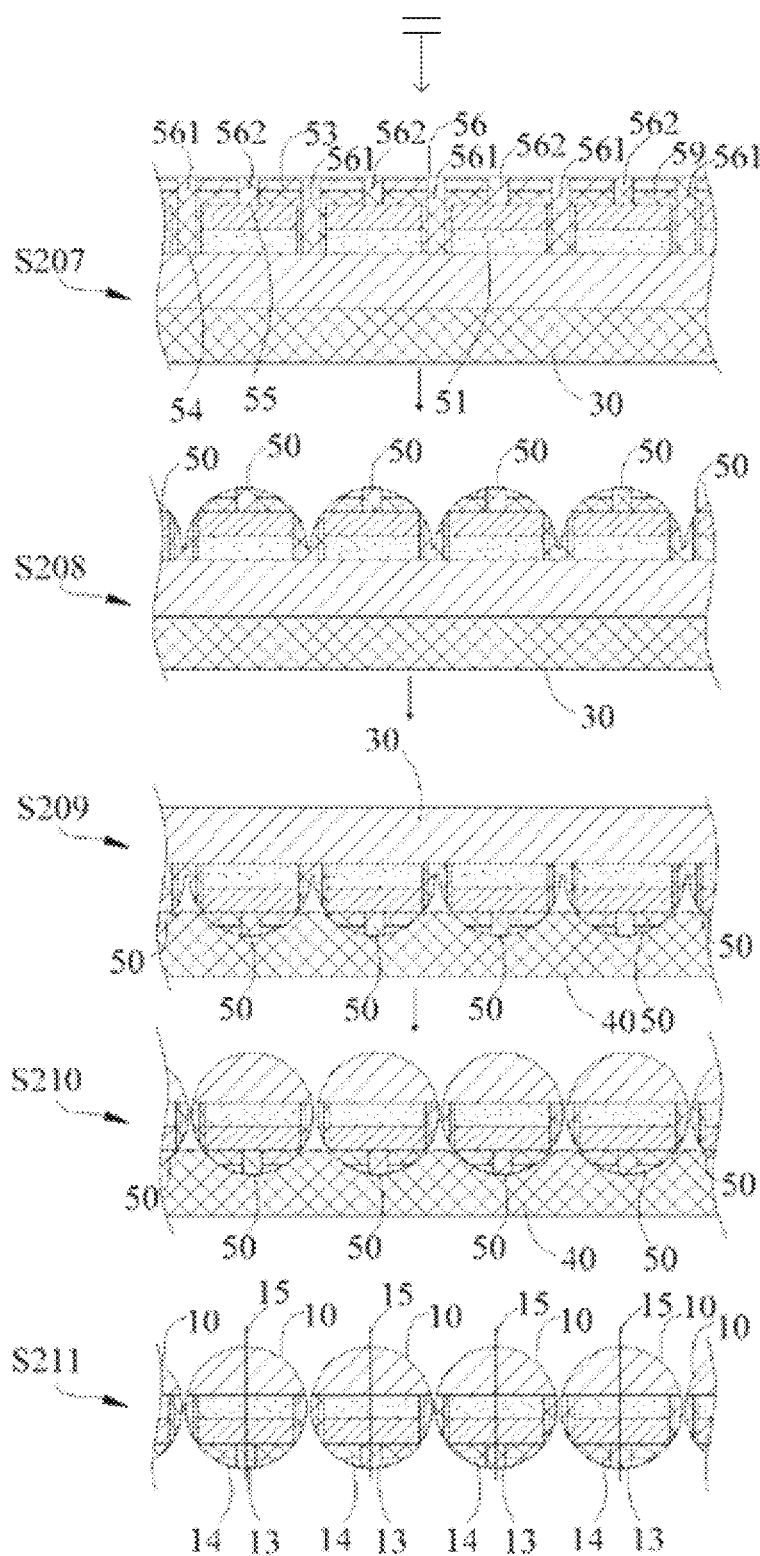

Referring to FIGS. 11A, 11B, 12A and 12B, FIGS. 11A and 11B collectively show a schematic flow chart illustrating a manufacturing method of a spherical light-emitting chip in an implementation of the disclosure, and FIGS. 12A and 12B collectively show a schematic flow chart illustrating a manufacturing method of a spherical light-emitting chip in an implementation of the disclosure. In another implementation of the disclosure, a manufacturing method of the spherical light-emitting chip 10 is further provided and includes operations at S201, S202, S203, S204, S205, S206, S207, S208, S209, S210, and S211, which are described in detail as follows.

S201, provide a first bearing substrate 30.

S202, sequentially manufacture a first-semiconductor blank layer 57, a light-emitting blank layer 51, and a second-semiconductor blank layer 58 on the first bearing substrate 30.

Specifically, the first-semiconductor blank layer 57 may be made of a material including, but not limited to, GaP, InP, InN, or GaN. The first-semiconductor blank layer 57 may be manufactured in a manner including, but not limited to, vapor deposition or evaporation. It can be understood that the first-semiconductor blank layer 57 may also be manufactured through other processes. The first-semiconductor blank layer 57 may be, but is not limited to, an N-type semiconductor and is configured to inject electrons into the light-emitting blank layer 51.

The light-emitting blank layer 51 may be made of a material including, but not limited to, GaN or InGaN. The light-emitting blank layer 51 may be manufactured in a manner including, but not limited to, vapor deposition or evaporation. It can be understood that the light-emitting blank layer 51 may also be manufactured through other processes.

The second-semiconductor blank layer 58 may be made of a material including, but not limited to, GaP, InP, InN, or GaN. The second-semiconductor blank layer 58 may be manufactured in a manner including, but not limited to, vapor deposition or evaporation. It can be understood that the second-semiconductor blank layer 58 may also be manufactured through other processes. The second-semiconductor blank layer 58 may be, but is not limited to, a P-type semiconductor and is configured to inject holes into the light-emitting blank layer 51.

S203, perform array segmentation on the second-semiconductor blank layer 58 and the light-emitting blank layer 51 to define multiple first through holes 52 that penetrate through the second-semiconductor blank layer 58 and the light-emitting blank layer 51 and are arranged at intervals.

Specifically, the array segmentation on the second-semiconductor blank layer 58 and the light-emitting blank layer 51 may be implemented in a manner including, but not limited to, laser. The first through hole 52 penetrates through the second-semiconductor blank layer 58 and the light-emitting blank layer 51. The first through hole 52 may be in a shape including, but not limited to, a cuboid or a similar cuboid. It can be understood that the shape of the first through hole 52 shall not be a limit to the first through hole 52 provided in the implementation. The first through holes 52 are arranged at intervals, and the first through holes 52 may be spaced apart from each other by a same distance or different distances.

S204, cover, with an insulation blank layer 59, a surface of the first-semiconductor blank layer 57, a surface of the light-emitting blank layer 51, and a surface of the second-semiconductor blank layer 58, where the insulation blank layer 59 includes an insulation body layer 591 and insulation blank portions 592 each received in one first through hole 52.

Specifically, the insulation blank layer 59 may be manufactured in a manner including, but not limited to, vapor deposition or evaporation. It can be understood that the insulation blank layer 59 may also be manufactured through other processes. The insulation blank layer 59 includes the insulation body layer 591 and the insulation blank portions 592 each received in one first through hole 52. The insulation body layer 591 may be, but is not limited to, part of the insulation blank layer 59 covering the first-semiconductor blank layer 57, and the insulation blank portion 592 may be, but is not limited to, part of the insulation blank layer 59 received in the first through hole 52.

S205, cover an alignment-guiding blank layer 53 on a surface of the insulation blank layer 59.

Specifically, the alignment-guiding blank layer 53 may be manufactured in a manner including, but not limited to, vapor deposition or evaporation. The alignment-guiding blank layer 53 may be, but is not limited to, formed by charged particles, and precise transferring and alignment of the spherical light-emitting chip 10 are achieved through electrostatic adsorption. The alignment-guiding blank layer 53 may also be made of a magnetic material, for example, an electrical steel, a rare earth alloy, a metal alloy, or a ferrite material, and thus precise alignment and transferring of the spherical light-emitting chip 10 can be achieved through magnetic adsorption.

S206, define multiple second through holes 54 penetrating through the alignment-guiding blank layer 53 and the insulation blank portion 592, and define multiple third through holes 55 penetrating through the alignment-guiding blank layer 53 and the insulation body layer 591.

Specifically, the second through hole 54 may be defined in a manner including, but not limited to, etching. The second through hole 54 may penetrate through the alignment-guiding blank layer 53 and the insulation blank portion 592.

The third through hole 55 may be defined in a manner including, but not limited to, etching. The third through hole 55 may penetrate through the alignment-guiding blank layer 53 and the insulation body layer 591.

S207, dispose a conductive layer 56 on the alignment-guiding blank layer 53. The conductive layer 56 may include first conductive portions 561 each received in one second through hole 54 and second conductive portions 562 each received in one third through hole 55.

Specifically, the conductive layer 56 may be formed on the alignment-guiding blank layer 53 in a manner including, but not limited to, vapor deposition or evaporation. The conductive layer 56 may be made of a material including, but not limited to, Ni/Au or Cr/Pt/Au.

S208, remove an excess portion of the insulation blank layer 59, an excess portion of the alignment-guiding blank layer 53, an excess portion of the first conductive portion 561, and an excess portion of the second conductive portion 562 to form a hemispherical light-emitting chip 50.

Specifically, the excess portion of the insulation blank layer 59, the excess portion of the alignment-guiding blank layer 53, the excess portion of the first conductive portion 561, and the excess portion of the second conductive portion 562 may be removed in a manner including, but not limited to, etching, to form the hemispherical light-emitting chip 50.

S209, provide a second bearing substrate 40 at a side of the hemispherical light-emitting chip 50 away from the first bearing substrate 30.

Specifically, the second bearing substrate 40 may be disposed at the side of the hemispherical light-emitting chip 50 away from the first bearing substrate 30, and the second bearing substrate 40 may be, but is not limited to, in contact with a hemispherical surface of the hemispherical light-emitting chip 50.

S210, peel off the first bearing substrate 30 and remove an excess portion of the first-semiconductor blank layer 57.

Specifically, the first bearing substrate 30 may be peeled off in a manner including, but not limited to, development stripping. The excess portion of the first-semiconductor blank layer 57 may be removed in a manner including, but not limited to, etching. The first-semiconductor blank layer 57 may be manufactured into a semi-spherical shape, thereby obtaining a complete spherical light-emitting chip 10.

S211, peel off the second bearing substrate 40 to obtain the spherical light-emitting chip 10.

Specifically, the second bearing substrate 40 may be peeled off in a manner including, but not limited to, development stripping, to obtain the spherical light-emitting chip 10. The first-semiconductor blank layer 57 forms the first semiconductor 17 of the spherical light-emitting chip 10. The light-emitting blank layer 51 forms the light-emitting layer 11 of the spherical light-emitting chip 10. The second-semiconductor blank layer 58 forms the second semiconductor 18 of the spherical light-emitting chip 10. The insulation blank layer 59 forms the insulation layer 19 of the spherical light-emitting chip 10. The insulation body layer 591 forms the second insulation portion 192 of the spherical light-emitting chip 10. The insulation blank portion 592 forms the first insulation portion 191 of the spherical light-emitting chip 10. The first conductive portion 561 forms the first electrode 12 of the spherical light-emitting chip 10. The second conductive portion 562 forms the second electrode 13 of the spherical light-emitting chip 10. The alignment-guiding blank layer 53 forms the alignment guiding layer 14 of the spherical light-emitting chip 10. Furthermore, the spherical light-emitting chip 10 may have a central axis 15 passing through the sphere center of the spherical light-emitting chip 10. The second electrode 13 extends in the direction of the central axis 15, and the central axis 15 passes through the second conductive portion 562. The alignment guiding layer 14 is arranged around the second electrode 13, and the surface of the alignment guiding layer 14 surrounding the second electrode 13 is in contact with the peripheral side surface 112 of the second electrode 13. During transferring of the spherical light-emitting chip 10, the spherical light-emitting chip 10 can be precisely transferred to the target position under the guidance of the alignment guiding layer 14, and the alignment guiding layer 14 as a whole is arranged close to the central axis 15 of the spherical light-emitting chip 10, so that the spherical light-emitting chip 10 is more stable in alignment, thereby effectively improving transfer precision and transferring efficiency of the spherical light-emitting chip 10.

Figure 14A:
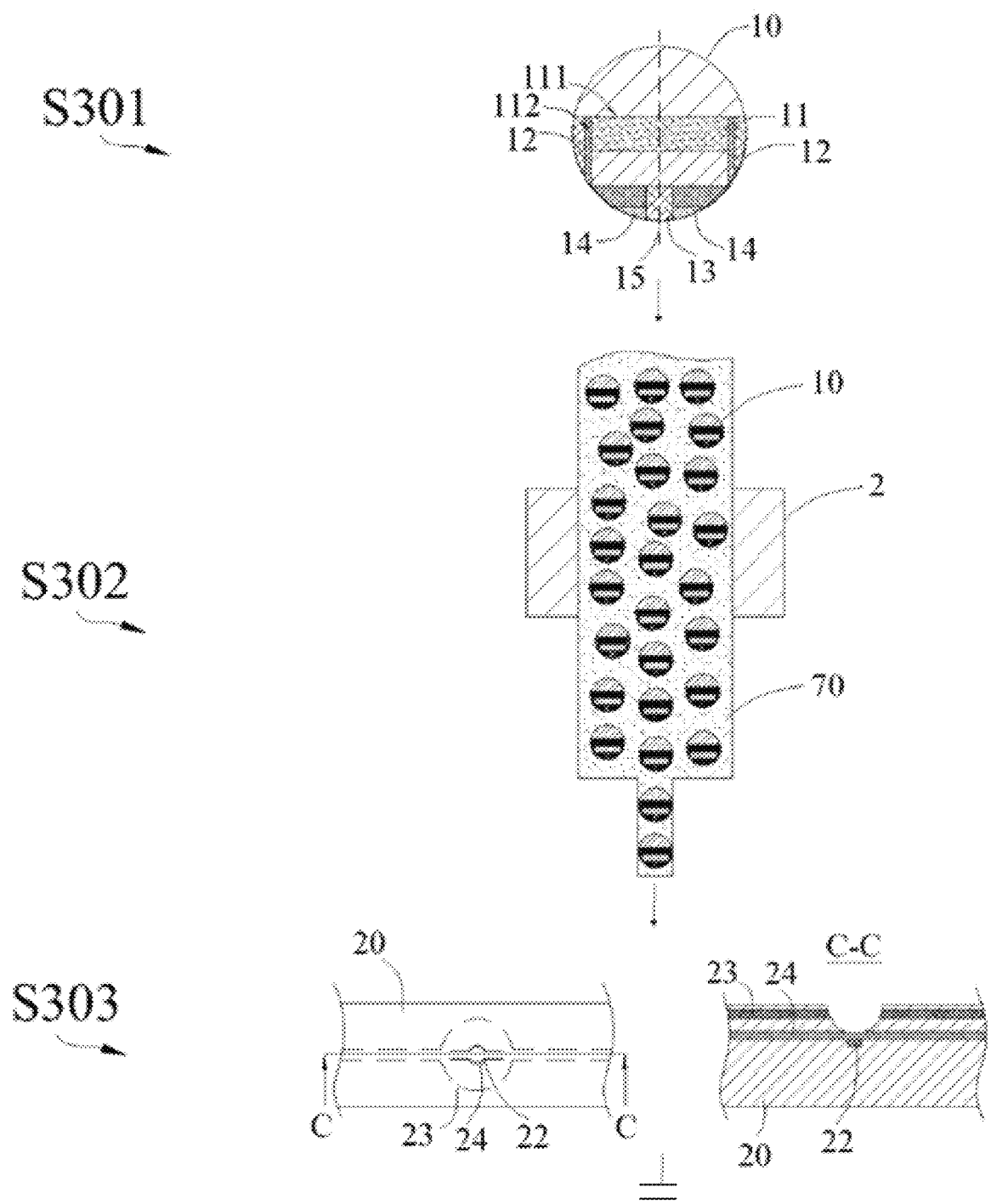
Figure 14B:
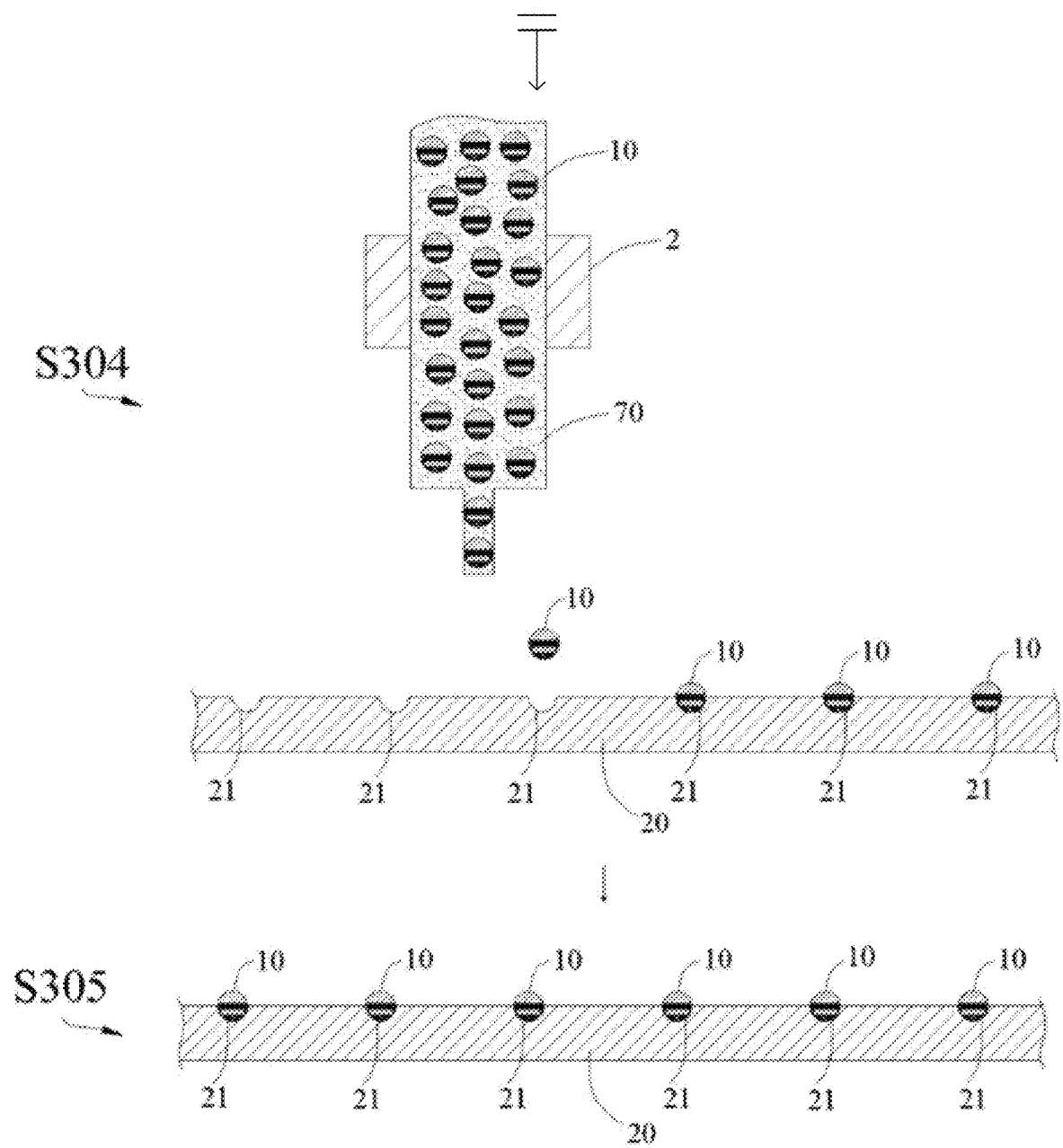

Referring to FIGS. 13, 14A and 14B, FIG. 13 is a schematic flow chart illustrating a transferring method of a spherical light-emitting chip in an implementation of the disclosure, and FIGS. 14A and 14B collectively show a schematic flow chart illustrating a transferring method of a spherical light-emitting chip in an implementation of the disclosure. A transferring method of the spherical light-emitting chip 10 is further provided in the disclosure and includes operations at S301, S302, S303, S304, and S305, which are described in detail as follows.

S301, provide a spherical light-emitting chip 10. The spherical light-emitting chip 10 includes a light-emitting layer 11, a first electrode 12, a second electrode 13, and an alignment guiding layer 14. The spherical light-emitting chip 10 has a central axis 15 passing through a sphere center of the spherical light-emitting chip 10. The second electrode 13 extends in a direction of the central axis 15, and the central axis 15 passes through the second electrode 13. The alignment guiding layer 14 is arranged around the second electrode 13, and a surface of the alignment guiding layer 14 surrounding the second electrode 13 is in contact with a peripheral side surface of the second electrode 13.

Specifically, the alignment guiding layer 14 may be, but is not limited to, formed by charged particles, and precise transferring and alignment of the spherical light-emitting chip 10 are achieved through electrostatic adsorption. The alignment guiding layer 14 may also be made of a magnetic material, for example, an electrical steel, a rare earth alloy, a metal alloy, or a ferrite material, and thus precise alignment and transferring of the spherical light-emitting chip 10 can be achieved through magnetic adsorption. During transferring of the spherical light-emitting chip 10, the spherical light-emitting chip 10 can be precisely transferred to the target position under the guidance of the alignment guiding layer 14, and the alignment guiding layer 14 as a whole is arranged close to the central axis 15 of the spherical light-emitting chip 10, so that the spherical light-emitting chip 10 is more stable in alignment.

S302, provide an inkjet device 2, mix a solvent with the spherical light-emitting chip 10 to form an ink 70, and inject the ink 70 into the inkjet device 2.

Specifically, the inkjet device 2 may be configured for inkjet printing. The spherical light-emitting chip 10 may be picked up in a manner including, but not limited to, electrostatic adsorption, and the ink 70 with the spherical light-emitting chip 10 is formed through mixing the solvent with the spherical light-emitting chip 10, and the ink 70 with the spherical light-emitting chip 10 is injected into the inkjet device 2. The spherical light-emitting chip 10 after peeling off is mixed with the solvent to form the ink 70, and the ink 70 is injected into the inkjet device 2. Preferably, the solvent is a non-conductive solvent. The solvent may be one or more of alcohol, ester, benzene, ketone, or the like, where a volume ratio of each of alcohol, ester, benzene, ketone, or the like to water ranges from 30% to 70%, and whichever of alcohol, ester, benzene, ketone, or the like is easily ejected and dry is optimal.

S303, provide a substrate 60. The substrate 60 includes recesses 21, an alignment guiding member 22, a third electrode 23, and a fourth electrode 24.

Specifically, the substrate 60 may be, but is not limited to, a CMOS substrate, a TFT substrate, or an LCOS substrate. The substrate 60 may be made of a semiconductor material including, but not limited to, Si, SiC, GaN, Ge, GaAs, or InP. The substrate 60 may be made of a non-conductive material including, but not limited to, glass or sapphire. The substrate 60 may include, but is not limited to, a driving circuit, where the driving circuit may be configured to drive the spherical light-emitting chip 10. The driving circuit may be an active matrix driving circuit or a passive matrix driving circuit.

The alignment guiding member 22 may be, but is not limited to, formed by charged particles, and precise transferring and alignment of the spherical light-emitting chip 10 are achieved through electrostatic adsorption. Specifically, when the alignment guiding layer 14 of the spherical light-emitting chip 10 consists of positively charged particles, the alignment guiding member 22 consists of negatively charged particles. When the alignment guiding layer 14 of the spherical light-emitting chip 10 consists of negatively charged particles, the alignment guiding member 22 consists of positively charged particles. During transferring of the spherical light-emitting chip 10, a movement posture of the spherical light-emitting chip 10 during transferring is adjusted under an electrostatic adsorption force generated between the alignment guiding layer 14 and the alignment guiding member 22, so that electrodes of the spherical light-emitting chip 10 can be in one-to-one correspondence with electrodes of the alignment guiding member 22. The alignment guiding member 22 may also be made of a magnetic material, for example, an electrical steel, a rare earth alloy, a metal alloy, or a ferrite material, and thus precise alignment and transferring of the spherical light-emitting chip 10 can be achieved through magnetic adsorption.

S304, the inkjet device 2 drops the ink 70 with the spherical light-emitting chip 10 into the recess 21 of the substrate 60.

Specifically, the inkjet device 2 can precisely control a speed and size of a droplet ejected from a jetting nozzle of the inkjet device 2 by operations including, but not limited to, controlling a driving pulse loaded on a piezoelectric element. Precise control of the size of the droplet ejected from the jetting nozzle of the inkjet device 2 can be achieved in a manner including, but not limited to, making the jetting nozzle of the inkjet device 2 eject an ink droplet with a single spherical light-emitting chip 10. By precisely controlling the speed of the droplet ejected from the jetting nozzle, the inkjet device 2 can precisely eject the ink droplet with the single light-emitting chip 10 into the recess 21 on the substrate 60. During ejection of the ink droplet with the spherical light-emitting chip 10 into the recess 21 on the substrate 60, the alignment guiding layer 14 of the spherical light-emitting chip 10 and the alignment guiding member 22 of the substrate 60 can attract the spherical light-emitting chip 10 through adsorption including, but not limited to, electrostatic adsorption or magnetic adsorption. In this way, the spherical light-emitting chip 10 can precisely fall into the recess 21 of the substrate 60, thereby implementing precise transferring of the spherical light-emitting chip 10.

The inkjet device 2 may, but is not limited to, adjust an inkjet frequency and a movement speed, to precisely match the target position of the spherical light-emitting chip 10, and further improve the transferring efficiency of the spherical light-emitting chip 10. Preferably, the inkjet device 2 may also be provided with multiple jetting nozzles for simultaneous operation, that is, the multiple jetting nozzles can simultaneously eject ink droplets with spherical light-emitting chips 10. The inkjet device 2 can precisely control the speed and size of the droplets ejected from the multiple jetting nozzles, thereby precisely ejecting multiple ink droplets with the spherical light-emitting chips 10 into the recesses 21 of the substrate 60 at the same time, achieving that the spherical light-emitting chips 10 are arranged in a row on the substrate 60, and greatly improving the transferring efficiency of the spherical light-emitting chips 10.

The spherical light-emitting chip 10 may include, but is not limited to, a spherical light-emitting chip 10 for Red (R) display, a spherical light-emitting chip 10 for Green (G) display, and a spherical light-emitting chip 10 for Blue (B) display. Preferably, the inkjet device 2 may be, but is not limited to, provided with multiple jetting nozzles, where the multiple jetting nozzles include a jetting nozzle filled with an ink with the spherical light-emitting chip 10 for R display, a jetting nozzle filled with an ink with the spherical light-emitting chip 10 for G display, and a jetting nozzle filled with an ink with the spherical light-emitting chip 10 for B display. The jetting nozzle filled with the ink with the spherical light-emitting chip 10 for R display, the jetting nozzle filled with the ink with the spherical light-emitting chip 10 for G display, and the jetting nozzle filled with the ink with the spherical light-emitting chip 10 for B display simultaneously operate, and the speed and size of the ink droplet ejected from each nozzle are precisely controlled, so as to achieve simultaneously precise transferring of the R spherical light-emitting chip 10, the G spherical light-emitting chip 10, and the B spherical light-emitting chip 10, therefore further greatly improving the transferring efficiency of the spherical light-emitting chip 10, and effectively solving a problem of mass chip transfer of the display device 1 with micro LEDs and mini LEDs.

When sub-pixels of a display panel of the display device 1 are designed in rows according to RGB, for example, R sub-pixels are arranged in a row, G sub-pixels are arranged in a row, and B sub-pixels are arranged in a row. In this case, jetting nozzles of the inkjet device 2 can be designed in multiple rows, for example, jetting nozzles in one row corresponding to R sub-pixels are for inkjet printing of the R spherical light-emitting chip 10, and jetting nozzles in another row corresponding to B sub-pixels are for inkjet printing of the B spherical light-emitting chip 10, and jetting nozzles in yet another row corresponding to G sub-pixels are for inkjet printing of the G spherical light-emitting chip 10. The jetting nozzles of the inkjet device 2 are disposed corresponding to sub-pixels and arranged in rows, thereby achieving printing of multiple spherical light-emitting chips 10 at one time, and achieving efficient and precise transferring of the multiple spherical light-emitting chips 10. In this way, efficiency of mass chip transfer of the display device 1 with micro LEDs and mini LEDs is effectively improved.

S305, encapsulate and solidify the spherical light-emitting chip 10 on the substrate 60.

Specifically, the spherical light-emitting chip 10 may be encapsulated with a martial including, but not limited to, epoxy resin. An encapsulation layer of the spherical light-emitting chip 10 may be solidified through a process including, but not limited to, ultraviolet irradiation, thereby facilitating encapsulation of the spherical light-emitting chip 10 on the substrate 60 and completing transferring of the chip to the substrate 60.

In conclusion, the transferring method of the spherical light-emitting chip 10 is provided in the implementation. Specifically, based on inkjet printing, a target position of the spherical light-emitting chip 10 can be matched by adjusting an inkjet frequency and a movement speed, and the spherical light-emitting chip 10 can be flexibly transferred by adjusting the inkjet frequency and the movement speed in real time. Moreover, based on electrostatic adsorption or magnetic alignment, transferring precision of the spherical light-emitting chip 10 can be effectively improved, and a transfer yield of the spherical light-emitting chip 10 can be improved, so that the spherical light-emitting chip 10 can be encapsulated and solidified after the spherical light-emitting chip 10 is transferred once. With inkjet printing, man-hours of reciprocally picking up and releasing the spherical light-emitting chip 10 can be saved, thereby improving the transferring efficiency. Furthermore, compared with methods for chip transferring such as a fluid self-assembly method and point-to-point transfer, with the transferring method of the spherical light-emitting chip 10 based on inkjet printing, the loss and waste of raw materials can be reduced. With regard to an arrayed layout of the display substrate 20, the transferring method of the spherical light-emitting chip 10 based on inkjet printing may be to, but is not limited to, arrange multiple jetting nozzles that can operate in parallel, thereby further improving the transferring efficiency of the spherical light-emitting chip 10. The transferring method of the spherical light-emitting chip 10 based on inkjet printing may also achieve, but is not limited to, simultaneous transferring of multiple types of chips, for example, simultaneous transferring of an R chip, a G chip, and a B chip to form a pixel unit, thereby further improving the transferring efficiency of the spherical light-emitting chip 10.

The term "implementation" or "embodiment" referred to herein means that a particular feature, structure, or feature described in conjunction with the implementation or embodiment may be contained in at least one implementation of the disclosure. Phrases appearing in various places in the specification does not necessarily refer to the same implementation, nor does it refer to an independent or alternative implementation that is mutually exclusive with other implementations. It is explicitly and implicitly understood by those skilled in the art that an implementation described herein may be combined with other implementations. In addition, it can be further understood that, the features, structures, or characteristics described in implementations of the disclosure may be combined arbitrarily without contradiction therebetween to form another implementation that does not depart from the spirit and scope of the technical solutions of the disclosure.

Finally, it should be noted that the foregoing implementations are merely intended to illustrate but not limit the technical solutions of the disclosure. Although the disclosure is described in detail with reference to the foregoing optimal implementations, those of ordinary skill in the art should understand that modifications or equivalent replacements can be made to the technical solutions of the disclosure without departing from the spirit and scope of the technical solutions of the disclosure.

What is claimed is:

1. A spherical light-emitting chip, comprising:
   a light-emitting layer;
   a first electrode spaced apart from the light-emitting layer;
   a second electrode spaced apart from the light-emitting layer, wherein the second electrode and the first electrode are configured to load a voltage to enable the light-emitting layer to emit light, the spherical light-emitting chip has a central axis passing through a sphere center of the spherical light-emitting chip, the second electrode extends in a direction of the central axis, and the central axis passes through the second electrode; and
   an alignment guiding layer arranged around the second electrode, wherein a surface of the alignment guiding layer surrounding the second electrode is in contact with a peripheral side surface of the second electrode.

2. The spherical light-emitting chip of claim 1, wherein the light-emitting layer has a light-exiting surface and a peripheral side surface, wherein the peripheral side surface of the light-emitting layer is connected to the light-exiting surface of the light-emitting layer in a bent manner and is arranged around the light-exiting surface; and
   the second electrode is disposed at a side of the light-emitting layer away from the light-exiting surface.

3. The spherical light-emitting chip of claim 2, wherein the alignment guiding layer is disposed at an end of the second electrode away from the light-emitting layer, and the alignment guiding layer forms part of an appearance surface of the spherical light-emitting chip.

4. The spherical light-emitting chip of claim 2, wherein the first electrode is arranged around the peripheral side surface of the light-emitting layer.

5. The spherical light-emitting chip of claim 2, further comprising:
   a first semiconductor covering and in contact with the light-exiting surface of the light-emitting layer, wherein the first semiconductor is in conduction with the first electrode;
   a second semiconductor disposed on a surface of the light-emitting layer away from the light-exiting surface, wherein the second semiconductor is in conduction with the second electrode, and a peripheral side surface of the second semiconductor is spaced apart from the first electrode; and
   an insulation layer comprising a first insulation portion and a second insulation portion connected to the first insulation portion, wherein the first insulation portion is disposed at a periphery of the second insulation portion and is connected to the second insulation portion in a bent manner, one end of the first insulation portion away from the second insulation portion is arranged between the peripheral side surface of the light-emitting layer and the first electrode, another end of the first insulation portion adjacent to the second insulation portion is arranged between the peripheral side surface of the second semiconductor and the first electrode, and the second insulation portion surrounds the second electrode and is arranged between the alignment guiding layer and the second semiconductor.

6. The spherical light-emitting chip of claim 1, having a sphere-center plane passing through the sphere center of the spherical light-emitting chip, wherein the light-emitting layer is disposed on the sphere-center plane of the spherical light-emitting chip, and the sphere-center plane is perpendicular to the central axis.

7. The spherical light-emitting chip of claim 1, wherein the spherical light-emitting chip has a diameter D;
   a height $H_1$ of the first electrode along the central axis satisfies: $H_1 < 0.5*D$; and
   a height $H_2$ of the second electrode along the central axis satisfies: $H_2 < 0.5*D$.

8. A display device, comprising:
   a display substrate defining at least one recess; and
   at least one spherical light-emitting chip, wherein each of the at least one spherical light-emitting chip is received in one of the at least one recess and comprises:
   a light-emitting layer;
   a first electrode spaced apart from the light-emitting layer;
   a second electrode spaced apart from the light-emitting layer, wherein the second electrode and the first electrode are configured to load a voltage to enable the light-emitting layer to emit light, the spherical light-emitting chip has a central axis passing through a sphere center of the spherical light-emitting chip, the second electrode extends in a direction of the central axis, and the central axis passes through the second electrode; and
   an alignment guiding layer arranged around the second electrode, wherein a surface of the alignment guiding layer surrounding the second electrode is in contact with a peripheral side surface of the second electrode.

9. The display device of claim 8, wherein the light-emitting layer has a light-exiting surface and a peripheral side surface, wherein the peripheral side surface of the light-emitting layer is connected to the light-exiting surface of the light-emitting layer in a bent manner and is arranged around the light-exiting surface; and
   the second electrode is disposed at a side of the light-emitting layer away from the light-exiting surface.

10. The display device of claim 9, wherein the alignment guiding layer is disposed at an end of the second electrode away from the light-emitting layer, and the alignment guiding layer forms part of an appearance surface of the spherical light-emitting chip.

11. The display device of claim 9, wherein the first electrode is arranged around the peripheral side surface of the light-emitting layer.

12. The display device of claim 9, wherein the spherical light-emitting chip further comprises:
   a first semiconductor covering and in contact with the light-exiting surface of the light-emitting layer, wherein the first semiconductor is in conduction with the first electrode;
   a second semiconductor disposed on a surface of the light-emitting layer away from the light-exiting surface, wherein the second semiconductor is in conduction with the second electrode, and a peripheral side surface of the second semiconductor is spaced apart from the first electrode; and an insulation layer comprising a first insulation portion and a second insulation portion connected to the first insulation portion, wherein the first insulation portion is disposed at a periphery of the second insulation portion and is connected to the second insulation portion in a bent manner, one end of the first insulation portion away from the second insulation portion is arranged between the peripheral side surface of the light-emitting layer and the first electrode, another end of the first insulation portion adjacent to the second insulation portion is arranged between the peripheral side surface of the second semiconductor and the first electrode, and the second insulation portion surrounds the second electrode and is arranged between the alignment guiding layer and the second semiconductor.

13. The display device of claim 8, wherein the spherical light-emitting chip has a sphere-center plane passing through the sphere center of the spherical light-emitting chip, wherein the light-emitting layer is disposed on the sphere-center plane of the spherical light-emitting chip, and the sphere-center plane is perpendicular to the central axis.

14. The display device of claim 8, wherein the spherical light-emitting chip has a diameter D;
a height $H_1$ of the first electrode along the central axis satisfies: $H_1<0.5*D$; and
a height $H_2$ of the second electrode along the central axis satisfies: $H_2<0.5*D$.

15. The display device of claim 8, comprising an alignment guiding member disposed on the display substrate and disposed corresponding to the recess, wherein the alignment guiding member is configured to position the spherical light-emitting chip through attraction between the alignment guiding member and the alignment guiding layer of the spherical light-emitting chip.

16. The display device of claim 15, wherein the alignment guiding member is disposed on a bottom of the recess.

17. The display device of claim 8, wherein the display substrate further comprises a third electrode and a fourth electrode, wherein the third electrode is connected to the first electrode and configured to transmit a voltage to the first electrode, and the fourth electrode is connected to the second electrode and configured to transmit a voltage to the second electrode.

18. The display device of claim 17, wherein the first electrode is arranged around the peripheral side surface of the light-emitting layer, and the third electrode is partially of an annular shape surrounding the spherical light-emitting chip.

19. The display device of claim 17, wherein a projection of a connection between the fourth electrode and the second electrode is circular.

20. A manufacturing method of a spherical light-emitting chip, comprising:
providing a first bearing substrate;
manufacturing a light-emitting blank layer on the first bearing substrate;
performing array segmentation on the light-emitting blank layer to define a plurality of first through holes that penetrate through the light-emitting blank layer and are arranged at intervals;
providing an alignment-guiding blank layer at a side of the light-emitting blank layer away from the first bearing substrate;
defining a plurality of second through holes penetrating through the alignment-guiding blank layer and a plurality of third through holes penetrating through the alignment-guiding blank layer;
disposing a conductive layer on the alignment-guiding blank layer, wherein the conductive layer comprises first conductive portions each received in one of the plurality of second through holes and second conductive portions each received in one of the plurality of third through holes, the first conductive portion is spaced apart from the light-emitting blank layer, the second conductive portion is spaced apart from the light-emitting blank layer, the alignment-guiding blank layer surrounds the second conductive portion, and a surface of the alignment-guiding blank layer surrounding the second conductive portion is in contact with a peripheral side surface of the second conductive portion;
removing an excess portion of the alignment-guiding blank layer, an excess portion of the first conductive portion, and an excess portion of the second conductive portion to form a hemispherical light-emitting chip;
providing a second bearing substrate at a side of the hemispherical light-emitting chip away from the first bearing substrate;
peeling off the first bearing substrate, and manufacturing an end of the hemispherical light-emitting chip away from the second bearing substrate to be in a hemispherical shape; and
peeling off the second bearing substrate to obtain a spherical light-emitting chip, wherein the spherical light-emitting chip has a central axis passing through a sphere center of the spherical light-emitting chip, the second conductive portion extends in a direction of the central axis, and the central axis passes through the second conductive portion.

* * * * *